US005953431A

United States Patent [19]

Yashima et al.

[11] Patent Number: 5,953,431

[45] Date of Patent: Sep. 14, 1999

[54] ACOUSTIC REPLAY DEVICE

[75] Inventors: Noboru Yashima; Masayuki Ishida, both of Nagaokakyo; Noboru Kyouno, Tokyo; Fumio Suzuki, Tokyo; Ko Nishino, Tokyo; Shinji Takeuchi, Nagaokakyo, all of Japan

[73] Assignee: Mitsubishi Denki Kabushiki Kaisha, Tokyo, Japan

[21] Appl. No.: 08/974,890

[22] Filed: Nov. 20, 1997

Related U.S. Application Data

[63] Continuation of application No. 08/434,599, May 4, 1995, abandoned.

[30] Foreign Application Priority Data

| | | | |
|---|---|---|---|
| May 6, 1994 | [JP] | Japan | 6-117705 |
| May 6, 1994 | [JP] | Japan | 6-117706 |
| Dec. 22, 1994 | [JP] | Japan | 6-320131 |
| Mar. 28, 1995 | [JP] | Japan | 7-069287 |

[51] Int. Cl.$^{6}$ ..... H03G 5/00

[52] U.S. Cl. ..... 381/103; 381/58; 381/59

[58] Field of Search ..... 381/58–59, 97–99, 381/100–103, 104, 107

[56] References Cited

U.S. PATENT DOCUMENTS

| | | | |
|---|---|---|---|
| 4,187,397 | 2/1980 | Modena et al. | 395/2.7 |
| 4,206,831 | 6/1980 | Welch et al. | 181/159 |
| 4,586,417 | 5/1986 | Kato et al. | 84/1.17 |
| 4,888,811 | 12/1989 | Takashi | 381/111 |
| 4,972,489 | 11/1990 | Oki et al. | 381/103 |
| 5,033,086 | 7/1991 | Fidi | 381/25 |
| 5,422,955 | 6/1995 | Guzman et al. | 381/77 |
| 5,481,615 | 1/1996 | Eatwell et al. | 381/103 |
| 5,511,129 | 4/1996 | Craven et al. | 381/59 |

FOREIGN PATENT DOCUMENTS

| | | |
|---|---|---|
| 53-120401 | 10/1978 | Japan . |
| 58-58012 | 3/1983 | Japan . |
| 61-5611 | 1/1986 | Japan . |
| 63-82198 | 4/1988 | Japan . |
| 2230402 | 10/1990 | United Kingdom . |
| 92/10876 | 6/1992 | United Kingdom . |
| 2252023 | 7/1992 | United Kingdom . |
| 2269969 | 2/1994 | United Kingdom . |

OTHER PUBLICATIONS

Kasuga, "AV and OA digital signal processing", p. 63, published Apr. 25, 1991 by Shobundo.

*Primary Examiner*—Curtis A. Kuntz
*Assistant Examiner*—Duc Nguyen

[57] ABSTRACT

To avoid degradation of the acoustic signal radiated from the opening of the ducted horn of a ducted horn type speaker, under influence of the ducted horn, below the characteristic of the speaker itself, and input terminal for receiving an audio signal, a non-recursive digital filter for varying the input audio signal, a power amplifier for amplifying the varied signal, and speaker for replaying the amplified signal are provided. The non-recursive digital filter realizes the inverse characteristic of the transfer characteristic of the ducted horn.

19 Claims, 34 Drawing Sheets

ACOUSTIC REPLAY DEVICE

This application is a continuation, of application Ser. No. 08/434,599 filed on May 4, 1995, now abandoned.

BACKGROUND OF THE INVENTION

The present invention relates to an acoustic replay device with improved replay characteristics for replaying acoustic signals with a high fidelity.

FIG. 35 is a diagram showing the configuration of a conventional acoustic replay device shown for example in Japanese Patent Kokai Publication No. 50812/1983. In the drawing, reference numeral 1 denote an input terminal, and 2 denotes a non-recursive digital filter for varying the transfer characteristic for the audio signal supplied to the input terminal 1. Reference numeral 3 denotes a power amplifier, 4 denotes a speaker, and 5 denotes a listening position. Transfer function H0 within block 100 represents the inverse characteristic of the frequency amplitude characteristic from the speaker 4 to the listening position 5, including the inverse characteristic of the speaker 4.

FIG. 36 is a diagram showing the configuration of a ducted horn type speaker, in which the speaker 4 in the conventional acoustic replay device is combined with a ducted horn 200 disposed on and attached to the speaker, e.g., in front of or on a front surface of the speaker. In the drawing, reference numerals 1 to 5 denote members corresponding to those in FIG. 35. Transfer function H1 within block 101 represents the inverse characteristic of the frequency amplitude characteristic from the speaker 4 to the listening position 5, including the inverse characteristic of the speaker 4 and the ducted horn 200.

FIG. 37 shows a replay characteristic of the speaker 4. FIG. 38 shows the transfer characteristic from speaker 4 to the listening position, specifically, the listening characteristic at the listening position 5 obtained when the audio signal is replayed by the configuration formed of the speaker 4 having the characteristic of FIG. 37 in combination with the ducted horn 200 shown in FIG. 36, and without the non-recursive digital filter 2.

FIG. 39 shows the inverse characteristic of the listening characteristic of FIG. 38. It is the transfer characteristic of the transfer function H1. FIG. 40 shows an example of the listening characteristic obtained when the audio signal is replayed by a conventional acoustic replay device. This corresponds to the listening characteristic at the listening position 5 obtained when the audio signal is replayed by the speaker 4 having the frequency-amplitude characteristic of FIG. 37, in the speaker configuration of FIG. 36.

The operation of acoustic replay device having the ducted horn type speaker configured as shown in FIG. 36 will now be discussed. The audio signal input via the input terminal 1 is converted by the non-recursive digital filter 2 having a transfer characteristic shown in FIG. 39. The transfer characteristic is identical to the transfer function H1, and is the synthetic characteristic of the inverse characteristic of the frequency-amplitude characteristic of the speaker 4, the inverse characteristic of the frequency-amplitude characteristic of the ducted horn 200, and the inverse characteristic of the transfer characteristic of the sound field space, that is the inverse characteristic of the speaker 4 of FIG. 37. The audio signal, having passed the non-recursive digital filter 2 at which its transfer characteristic can be varied, is then input to the power amplifier 3, where it is power-amplified, and radiated via the speaker 4, and via the ducted horn 200 and the sound field space to reach the listening position 5. As a result, the acoustic power at the listening position 5 is as shown in FIG. 40. FIG. 41 shows the acoustic characteristic of radiation at the opening of the ducted horn obtained when the listening characteristic of FIG. 40 is obtained at the listening position 5. That the listening characteristic of FIG. 40 is obtained means that the acoustic power radiated via the opening of the ducted horn 200 which is the sound source for the sound field space has the radiation acoustic characteristic of FIG. 41 at the listening position 5.

In another conventional acoustic replay device, the sound pressure frequency characteristic of the speaker at the listening position is automatically corrected by an adaptive signal processing. FIG. 42 shows the configuration of a conventional acoustic replay device using an equalizer for characteristic correction, shown for example in Japanese Patent Kokai Publication 120401/1978. In the drawing, reference numeral 11 denotes a player system, and 12 denotes a tape deck, both of which are examples of program sources. Reference numeral 13 denotes an equalizer, 14 denotes an amplifier, and 15 denotes a speaker. The equalizer 13, the amplifier 14 and the speaker 15 form an ordinary replay system. Reference numeral 16 denotes a microphone disposed at the listening position, 17 denotes an arithmetic operation section, 18 denotes a noise source, and 19 denotes a listener at the listening position.

The operation of the acoustic replay device of FIG. 42 will next be described. The noise signal x(t) from the noise source 18 is input via the amplifier 14 to the speaker 15, and also input to the arithmetic operation section 17. The noise signal x(t) radiated from the speaker 15 is input to the microphone 16, and input to the arithmetic operation section 17 as the listening signal containing information of the sound field space. The arithmetic operation section 17 performs the cross-spectrum calculation between the noise signal x(t) and the signal y(t), and thereby determines the transfer function of the acoustic replay system including the sound field space from the speaker 15 to the microphone 16, and then calculates the inverse characteristic thereof, to set the equalizer 13. By using the equalizer for the correction of the characteristic, the transfer characteristic of the acoustic replay system can be corrected, and the sound pressure frequency characteristic at the listening position can be flattened.

FIG. 43 is a block diagram showing the configuration of the arithmetic operation section 17 for the cross spectrum calculation in the acoustic replay device of FIG. 42. In the drawing, reference numeral 20 denotes an input terminal for the noise signal x(t), and 21 denotes an input terminal for the listening signal y(t) from the microphone 16. Reference numerals 22 and 23 denote A/D converters, 24 and 25 denote Fourier transform circuits, 26 denotes a separator, 27 and 28 denote multipliers, 29 denotes an arithmetic operation circuit, and 30 denotes a memory. x(t) and y(t) input at the input terminals 20 and 21 are quantized at the A/D converters 22 and 23, and Fourier-transformed at the Fourier transform circuits 24 and 25. A complex signal X corresponding to the noise signal x(t), obtained as a result of the frequency transform is input to the separator 26, while the complex signal Y corresponding to the listening signal y(t), obtained as a result of the frequency conversion is input to the multiplier 28. The conjugate complex signal X* of the complex signal X is supplied from the separator 26 to the multipliers 27 and 28 where XX* and X* Y are calculated, and the inverse frequency characteristic for the correction is stored in the memory 30.

Since the conventional acoustic replay device is configured as described above, the listening characteristic detected at the listening position 5 is one obtained by synthesis of the direct sound from the source and the sound reflected in the sound field space. The reflected sound originates from the direct sound, so that if the direct sound is disturbed the resultant reflected sound is also disordered.

However, with the conventional acoustic replay device, where the audio signal is replayed using the non-recursive digital filter 2 having the characteristic of the transfer function H1 and the ducted horn type speaker, the acoustic power radiated via the opening of the ducted horn acting as the sound source, i.e., the signal detected as the direct sound at the listening position 5, has a characteristic inferior to compared with the replay characteristic of the speaker 4, as shown in FIG. 41.

Moreover, the characteristic of the speaker 4 differs from one lot to another, as shown in FIG. 44, and cannot be same even if the speakers are of the same type. Furthermore, when the type of the speaker is changed, the characteristic is varied substantially. For instance, the listening characteristic of the speaker having the replay characteristic shown in FIG. 45 will not be of the uniform frequency characteristic such as the listening characteristic of FIG. 40 even if correction is made using the non-recursive digital filter 2 having the transfer function H1. FIG. 46 shows an example of the listening characteristic obtained when the speaker of FIG. 45 is used. It is clearly different from the listening characteristic of FIG. 40. Where the correction characteristic of the non-recursive digital filter 2 is determined taking account of the frequency-amplitude characteristic of the speaker 4, the weighting coefficients must be altered to realize a different transfer function each time the characteristic of the speaker 4 is changed.

With the conventional acoustic replay device using the equalizer for characteristic correction, the arithmetic operations in the time domain and in the frequency domain are alternately effected, so that the procedure for the inverse frequency characteristic to be corrected is complicated. In addition, to improve the calculation accuracy, the size of the hardware needs to be enlarged, and the configuration is more complicated.

Another prior art acoustic replay device, such as the one described in "AV and OA digital signal processing", published on Apr. 25, 1991, by Shobundo, at page 63, is shown in FIG. 47.

When an analog signal is to be transmitted via a digital transmission path, or a signal is to be digitally recorded on a magnetic tape, a magnetic disk or the like and is thereafter replayed, coding is effected by an A/D converter or the like, and decoding is thereafter effected by which the digital signal is converted into an analog signal. The acoustic replay device of this type has been used frequently for replaying, in particular, acoustic signals with a high fidelity.

In FIG. 47, reference numeral 91 denotes an input terminal for an analog signal, 92 denotes a line amplifier for impedance-conversion of the input analog signal, 93 denotes a first low-pass filter for limiting the frequency band of the transmitted analog signal, 94 denotes an A/D converter for converting an analog signal into a digital signal, 95 denotes an arithmetic operation processing circuit for performing an arithmetic processing, such as a digital filtering, on the digital signal, 96 denotes a D/A converter for converting the digital signal, obtained as a result of the arithmetic operation by the arithmetic operation processing circuit 95, into an analog signal, and 97 denotes a second low-pass filter for removing unwanted high-frequency components from the analog signal output from the D/A converter 97. Reference numeral 98 denotes an output amplifier for amplifying the analog signal, and 99 denotes an output terminal for the analog signal.

FIG. 48 shows the transfer characteristic of the conventional acoustic replay device. It is shown that the pass band of the low-pass filters 93 and 97 are set to be below fs/2 where fs denotes the sampling frequency. It is to be noted that the arithmetic operation processing circuit 95 can handle signals of frequencies up to fs/2.

The operation of the conventional acoustic replay device described above will next be described.

Referring to FIG. 47, the input analog signal is subjected to impedance conversion using the line amplifier 92 having a flat frequency characteristic. The analog signal having been impedance-converted is band-limited by the low-pass filter into the frequency band defined by the sampling frequency for the arithmetic operation processing circuit 95. The band-limited analog signal is input to the A/D converter 94, and sampled at the sampling frequency fs, into predetermined sampling levels.

Thus, the digital signal from the A/D converter 94 is input to the arithmetic operation processing circuit 95, and subjected to predetermined processing. The arithmetic operation processing circuit 95 is, for example, in the form of a processing circuit for performing arithmetic operation, such as digital filtering, and additionally encoding for error correction or the like. The result of the arithmetic operation at the arithmetic operation processing circuit 95 is converted into an analog signal at the D/A converter 96. The analog signal is passed through the second low-pass filter 97, where frequency components above the one half the sampling frequency fs are removed, and is then output via the output amplifier 98 and the output terminal 99.

With the above arithmetic operation processing circuit 95, the analog signal components below one half the sampling frequency is processed, so that, in the acoustic replay device handling the digital signal so obtained, the frequency band which can be controlled by the sampling frequency of the system is up to one half the sampling frequency, and the analog signal components above that cannot be output from the acoustic replay device. That is, since the high-frequency components contained in the input analog signal are removed by the acoustic replay device, replay of the signals in the high-frequency region, which are particularly required of the acoustic signal, with high fidelity is not possible.

Expanding the frequency band which can be handled by the arithmetic operation processing circuit 95 will make it possible to achieve arithmetic operation over the entire frequency band of the input analog signal. But, for that, a high-speed digital processing circuits are required, and the cost of the circuit is increased.

SUMMARY OF THE INVENTION

The invention has been made to solve the problems described above, and its first object is to provide an acoustic replay device with which the acoustic power radiated via the opening of the ducted horn acting as the sound source has a characteristic which is not inferior to the characteristic of the speaker itself.

A second object of the invention is to provide an acoustic replay device which does not require alteration of the characteristic of the non-recursive digital filter even when the type of the ducted horn type speaker is altered.

A third object of the invention is to provide an acoustic replay device which uses adaptive signal processing to enable automatic correction of the inverse filter coefficient data for the correction of the sound pressure frequency characteristic at the listening position.

A fourth object of the invention is to provide an inexpensive acoustic replay device which enables replay, with a high fidelity, of the analog signal up to the frequency band higher than one-half the sampling frequency.

A fifth object of the invention is to provide an acoustic replay device with which the entire frequency band of the input signal can be transmitted, even where the input signal must be band-limited for an arithmetic operation processing circuit.

According to one aspect of the invention, there is provided an acoustic replay device for power-amplifying an audio signal varied by a non-recursive digital filter, and radiating the sound via a predetermined speaker, comprising a ducted horn disposed on the speaker;

an audio signal processing means including a non-recursive digital filter realizing an inverse characteristic of the transfer characteristic of the ducted horn.

With the above configuration, once the characteristic of the non-recursive digital filter is set to be the inverse characteristic of the ducted horn, the acoustic radiation characteristic at the opening of the ducted horn forming the sound source for the sound field space always matches the replay characteristic of the speaker, without regard to the type of the speaker, so that the effect of the ducted horn can be easily removed, and the acoustic signal can be radiated into the sound field space with a high fidelity, without deteriorating the characteristic of the speaker.

According to another aspect of the invention, there is provided an acoustic replay device for power-amplifying an audio signal varied by a non-recursive digital filter, and radiating the sound via a predetermined speaker, comprising a ducted horn disposed on the speaker;

an acoustic resistance disposed at an opening of the ducted horn;

an audio signal processing means including a non-recursive digital filter realizing an inverse characteristic of the synthetic transfer characteristic of the ducted horn and the acoustic resistance.

With the above configuration, once the characteristic of the non-recursive digital filter is set to be the inverse characteristic of the ducted horn and the acoustic resistance, the acoustic radiation characteristic at the opening of the ducted horn forming the sound source for the sound field space always matches the replay characteristic of the speaker, without regard to the type of the speaker, so that the effect of the ducted horn and the acoustic resistance can be easily removed, and the acoustic signal can be radiated into the sound field space with a high fidelity, without deteriorating the characteristic of the speaker.

The acoustic replay device may be further provided with a linear phase equalizer for varying the amplitude characteristic only of the audio signal.

With the above configuration, using the linear phase equalizer, only the amplitude characteristic of the acoustic characteristic of the radiation from the ducted horn can be altered and the phase characteristic of the speaker is not affected.

According to another aspect of the invention, there is provided an acoustic replay device for varying the audio signal by means of an adaptive finite impulse response (FIR) digital filter, and replaying the audio signal, comprising:

an audio signal processing means including said FIR digital filter;

a selecting means for selectively connecting the audio signal processing means to an audio signal source and a noise source; and an acoustic level detecting means disposed at a listening position for the replayed audio signal;

wherein the signal from said noise source is replayed by being selected by said selecting means, and the coefficient data for the inverse filter are generated and fixed for said FIR digital filter, on the basis of the signal detected by said acoustic level detecting means and the signal from the noise source, and the sound pressure frequency characteristic at the listening position is corrected using said FIR digital filter connected to said audio signal source by means of said selecting means.

With the above configuration, the coefficient data for the inverse filter can be calculated in the time domain only, by the adaptive signal processing in the audio signal processing means, so that the size of the hardware can be reduced, and the algorithm for the calculation can be simplified.

The acoustic level detecting means may comprise a remote controller with a microphone.

With the above arrangement, the received signal is transmitted without using connecting wire, i.e., by means of a remote controller with a microphone, so that the calculation of the coefficient data for the inverse filter upon change of the listening position can be achieved efficiently.

The audio signal processing means may comprise a digital filter for correcting the sound pressure frequency characteristic, in addition to the FIR digital filter for generating the coefficient data for the inverse filter.

With the above arrangement, the coefficient data calculation section for the inverse filter in the form of the adaptive FIR digital filter, and the FIR digital filter for implementing the actual characteristic correction are separately formed, so that the algorithm for calculation for replay of the audio signal can be simplified.

The audio signal processing means may comprise a transmission path connected to an adder, in addition to a plurality of coefficient multipliers forming a digital filter.

With the above arrangement, the input signal is connected to the adder, by means other than the plurality of coefficient multipliers forming the digital filter, so that the even when an electro-acoustic transducer which differs from the correction characteristic set by the audio signal processing means is used, the audio signal replay characteristic is not disturbed.

The audio signal processing means may comprise a coefficient multiplier for adjusting the amplitude level of the audio signal, in addition to a plurality of coefficient multipliers forming a digital filter.

With the above arrangement, the coefficient multiplier for adjusting the amplitude level of the audio signal is provided, in addition to the plurality of coefficient multipliers forming the digital filter, so that it is possible to replay an audio signal having its amplitude level corrected, without correcting the sound pressure frequency characteristic.

It may be so arranged that a digital filter forming said audio signal processing means is so configured that one of a plurality of coefficient multipliers forming a digital filter is selected in accordance with a selection control signal.

With the above arrangement, when the audio signal is replayed by an electro-acoustic transducer having a characteristic different from a characteristic of an electro-acoustic transducer set in the audio signal processing means, one of the plurality of coefficient multipliers forming the digital filter is selected in accordance with a selection control signal, so that it is not necessary to provide a transmission path other than the audio signal processing means.

According to another aspect of the invention, there is provided an acoustic replay device for converting an input analog signal to a digital signal, an arithmetic operation processing circuit for processing the digital signal obtained by conversion at said A/D converter, and a D/A converter for converting a digital signal output from said arithmetic operation processing circuit into an analog signal, and comprises:

- a high-pass filter for extracting, from said input analog signal, a signal component of a frequency band higher than the frequency band processed by said arithmetic operation processing circuit; and
- an adding means for adding the signal component extracted by said high-pass filter, to the analog signal obtained by the processing at the arithmetic operation processing circuit and the conversion at the D/A converter.

With the above arrangement, of the input analog signal, the analog signal of the frequency band component which is suppressed at the input of the arithmetic operation processing circuit is extracted by a high-pass filter, and added to the analog signal having been subjected to digital arithmetic operation, and output from a D/A converter. Accordingly, the analog signal outside of the frequency band of of the arithmetic processing circuit is transmitted via a separate path, and added to the signal having been digitally processed at the arithmetic processing circuit. As a result, transmission of all the frequency band of the input analog signal can be achieved at a low cost.

The acoustic replay device may further comprise a signal amplifying means for converting the analog signal level of the signal component extracted by said high-pass filter.

With the above arrangement, the level of the analog signal having passed the high-pass filter is adjusted by the signal amplifying means, into conformity with the output of the signal having received the arithmetic operation processing, i.e., the analog signal component output from the D/A converter.

The acoustic replay device may further comprise a delay means for delaying the signal component extracted by said high-pass filter.

With the above arrangement, the analog signal extracted by the high-pass filter or the analog signal having been amplitude-adjusted by the signal amplifying means is delayed for a delay time corresponding to the delay time of the digital arithmetic operation processing circuit, and is then added to the analog signal component output from the D/A converter.

DETAILED DESCRIPTION OF THE PREFERRED EMBODIMENTS

Embodiments of the invention will now be described with reference to the accompanying drawings.

Embodiment 1

Figure 1:
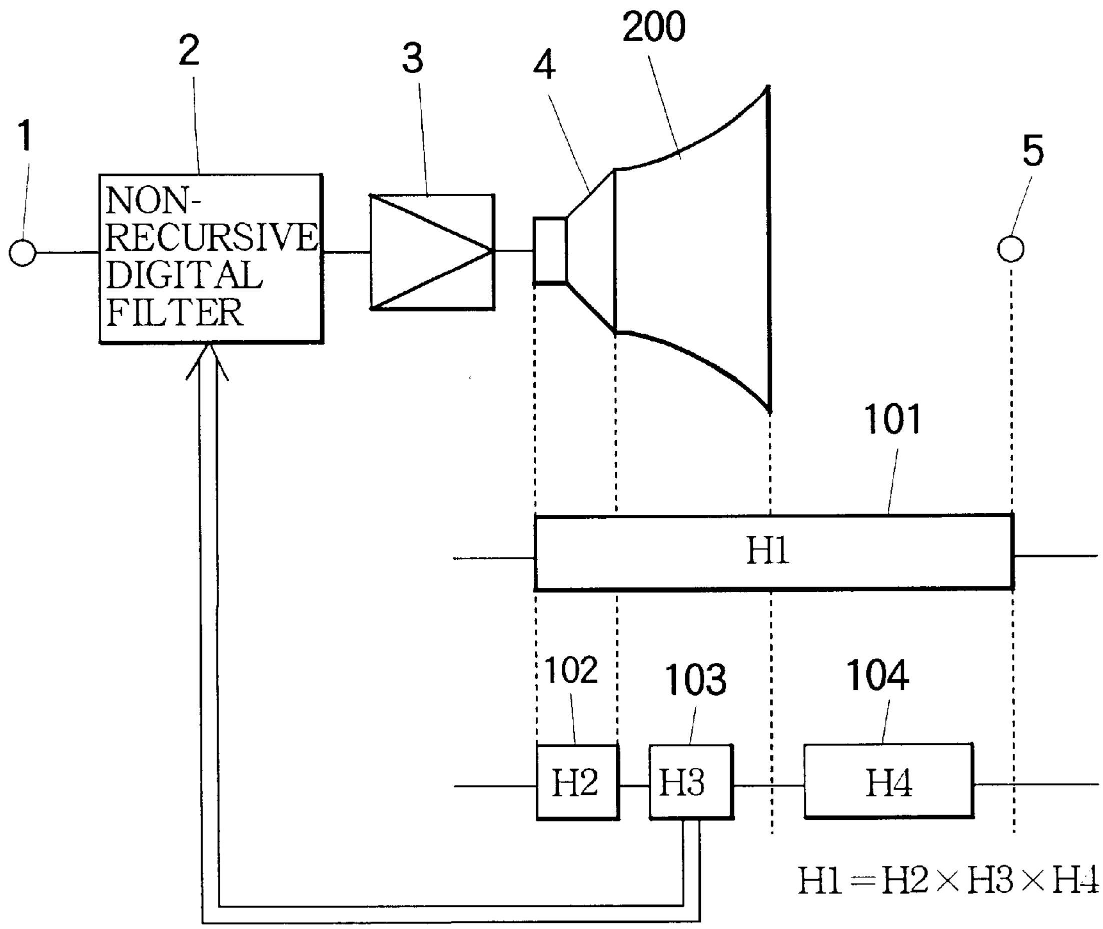
FIG. 1 is a diagram showing the configuration of the acoustic replay device in Embodiment 1 of the invention.
Figure 36:
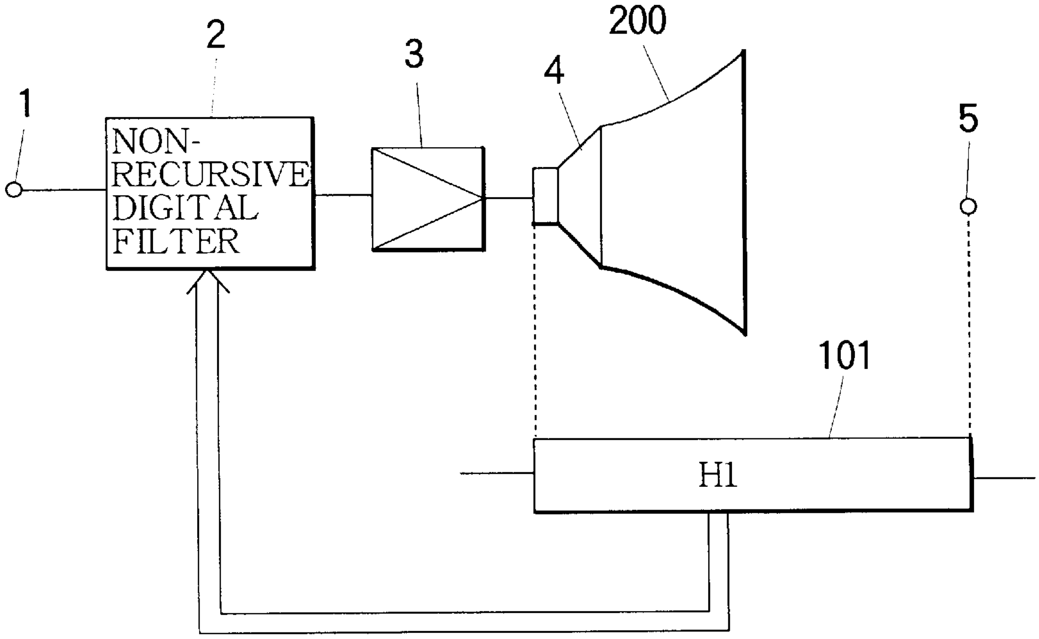
FIG.36 PRIOR ART
FIG. 36 is a diagram showing the configuration of the ducted horn type speaker having a speaker combined with a ducted horn, in the conventional acoustic replay device.

FIG. 1 shows the configuration of the acoustic replay device of Embodiment 1 of the invention. In the drawing, reference numerals 1 to 5, and 101 and 200 denote members identical to those in the conventional device (FIG. 36), and their description is omitted. Transfer function H2 within block 102 represents the inverse characteristic of the frequency-amplitude characteristic of the speaker 4 alone, Transfer function H3 within block 103 represents the inverse characteristic of the frequency-amplitude characteristic of the ducted horn 200 alone, and transfer function H4 within block 104 represents the characteristic of the acoustic space from the opening of the ducted horn 200 to the listening position 5. The coefficient data of the non-recursive digital filter 2 is so set that the non-recursive digital filter 2 has the transfer function H3.

Figure 2:
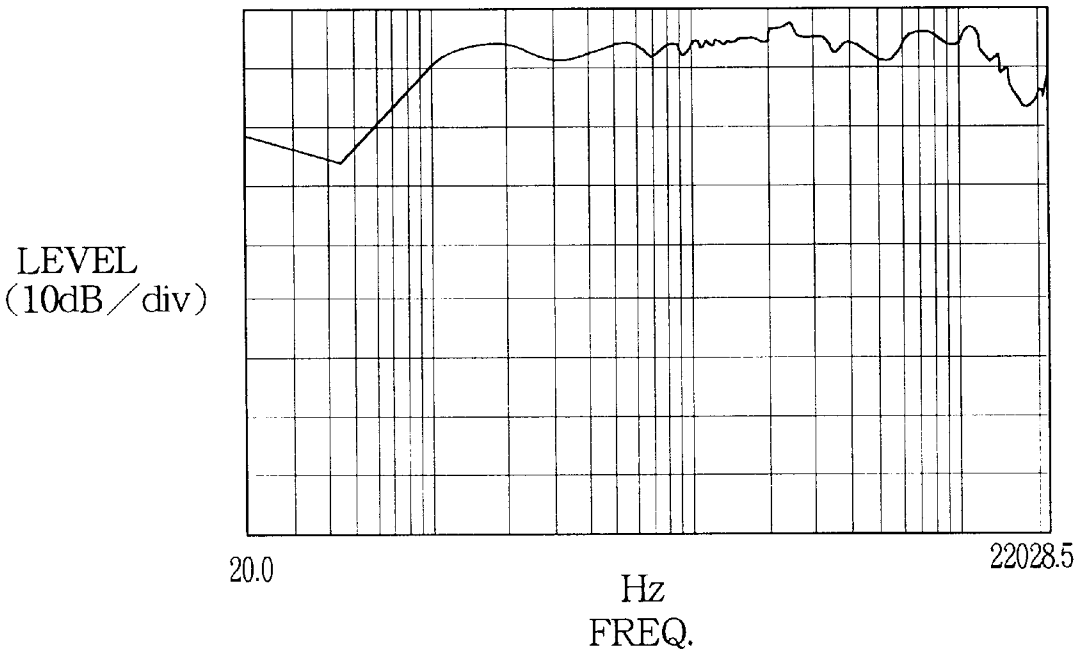
FIG. 2 is a diagram showing an example of a replay characteristic of a speaker in Embodiment 1.
Figure 3:
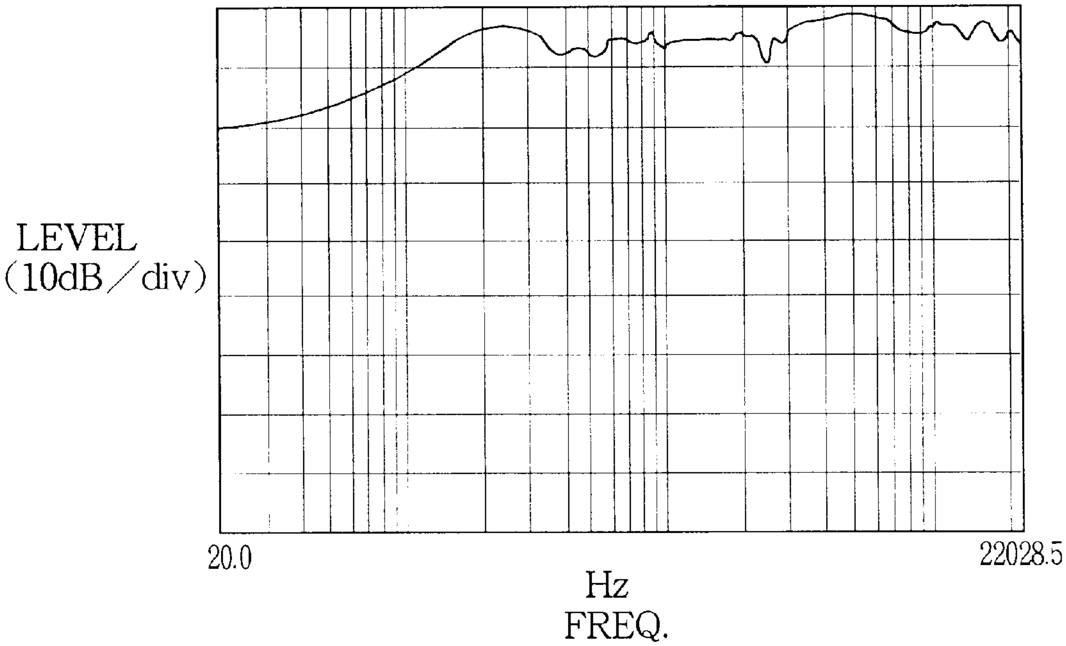
FIG. 3 is a diagram showing a replay characteristic of another speaker in Embodiment 1.

FIG. 2 shows an example of the replay characteristic of the acoustic replay device using the speaker 4 as the electro-acoustic transducer, and shows the radiation acoustic characteristic at the opening of the ducted horn 200. Because the inverse characteristic of the ducted horn 200 is realized by the non-recursive digital filter 2, the replay characteristic shown in FIG. 2 is the result of synthesis of the replay characteristic of the speaker 4, the characteristic of the ducted horn 200 and the inverse characteristic of the ducted horn 200. Because the characteristic of the ducted horn 200 and the inverse characteristic of the ducted horn 200 cancel each other, the resultant characteristic is identical to the replay characteristic of the speaker shown in FIG. 37. FIG. 3 shows the replay characteristic of the acoustic replay device using a speaker having a different replay characteristic shown in FIG. 45. In this case too, the radiation acoustic characteristic at the opening of the ducted horn 200 is determined by the transfer function H3, so that the result is identical to the replay characteristic of the speaker shown in FIG. 45.

The replay operation of acoustic replay device of Embodiment 1 will next be described. The audio signal received at the input terminal 1 is varied at the non-recursive digital filter 2 having the transfer function H3. The non-recursive digital filter 2 of the transfer function H3 serves to cancel the transfer characteristic of the ducted horn 200. The audio signal varied by the transfer characteristic of the non-recursive digital filter 2 is input to the power amplifier 3, where it is power-amplified, and then radiated, as the acoustic power, from the speaker 4 to the space via the opening of the ducted horn 200.

Figure 37:
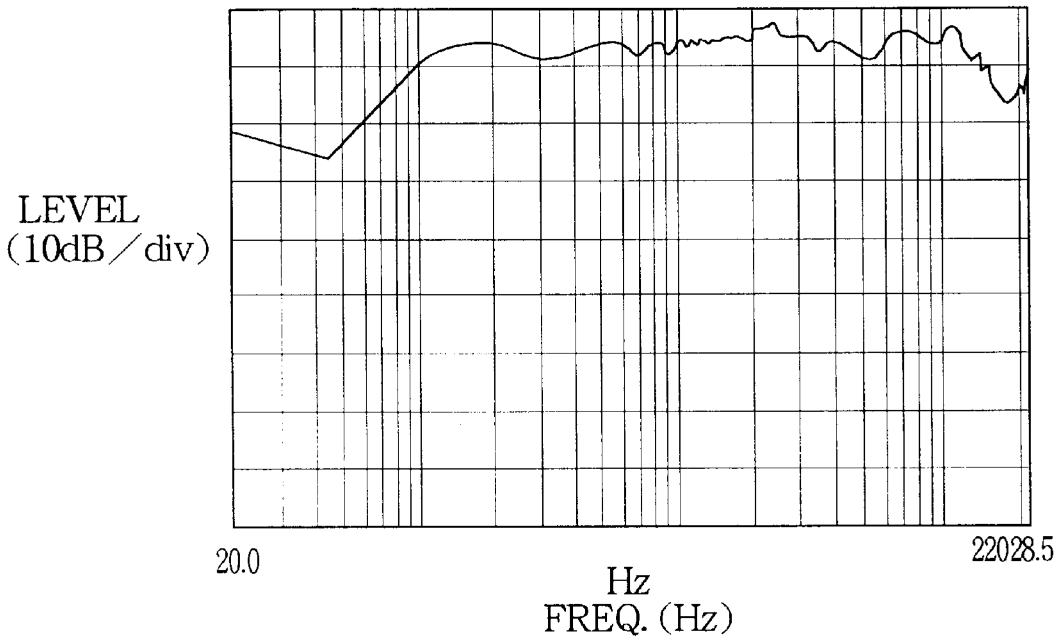
FIG.37 PRIOR ART
FIG. 37 is a diagram showing the replay characteristic of the speaker itself used in the conventional acoustic replay device.
Figure 38:
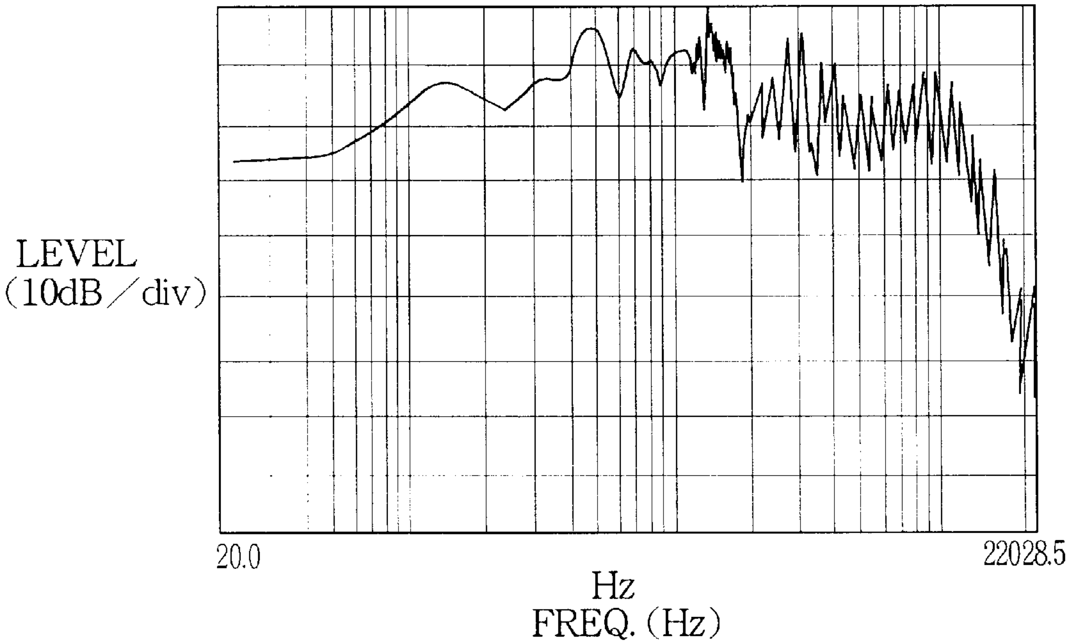
FIG.38 PRIOR ART
FIG. 38 is a diagram showing the transfer characteristic from the speaker in the conventional acoustic replay device to the listening position.
Figure 39:
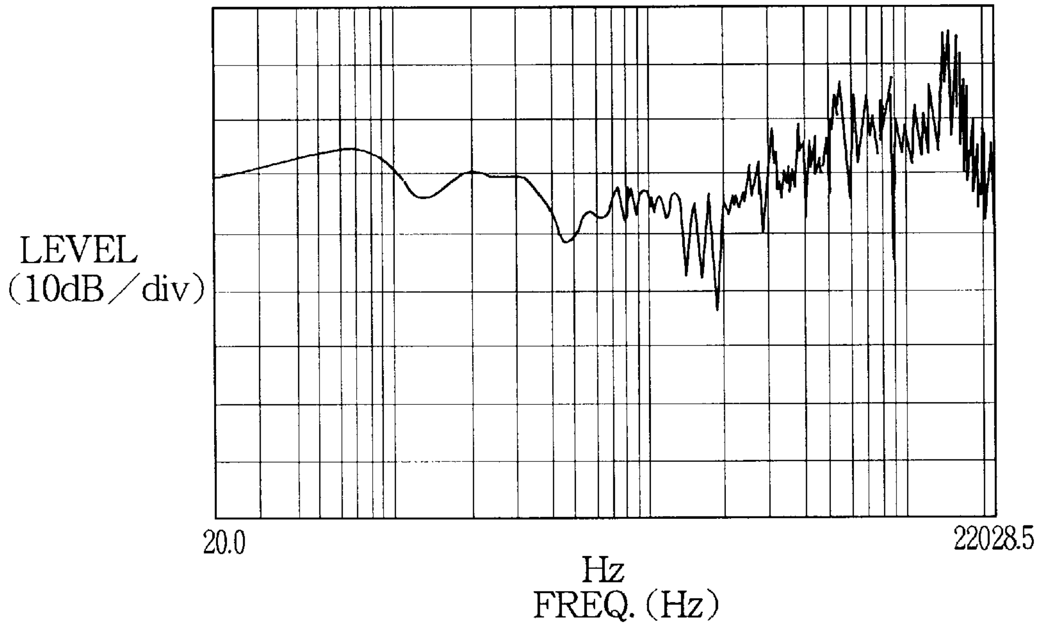
FIG.39 PRIOR ART
FIG. 39 is a diagram showing the inverse characteristic of the transfer characteristic of FIG. 38.
Figure 40:
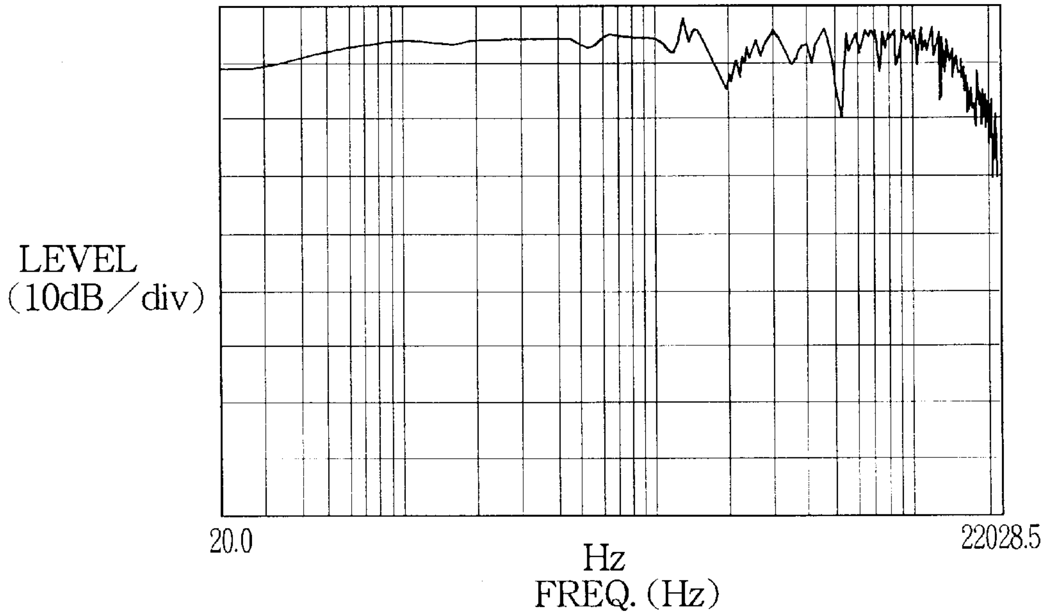
FIG.40 PRIOR ART
FIG. 40 is a diagram showing an example of the listening characteristic in the replay of the acoustic replay device of FIG. 36.
Figure 41:
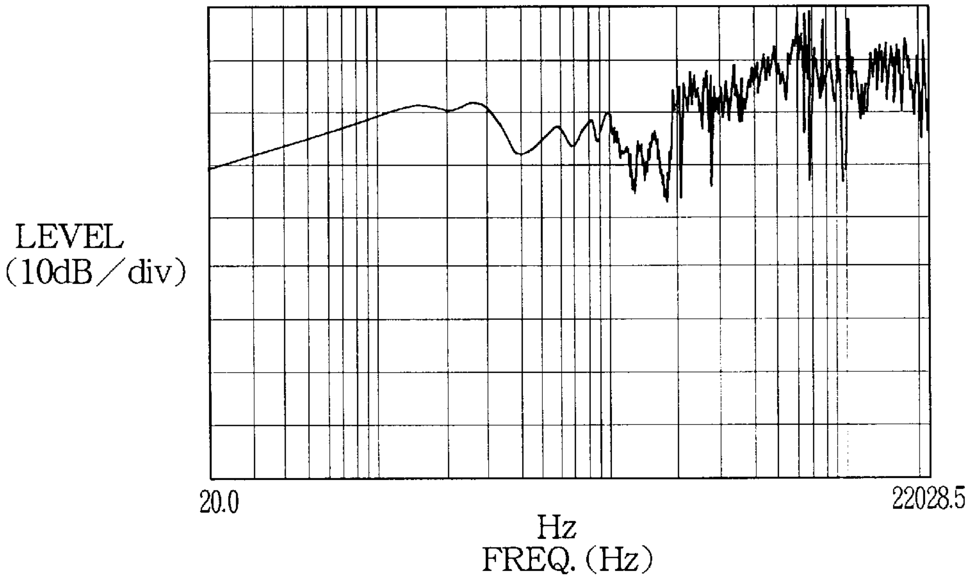
FIG.41 PRIOR ART
FIG. 41 is a diagram showing the radiation acoustic characteristic at the opening of the ducted horn in the conventional acoustic replay device.
Figure 42:
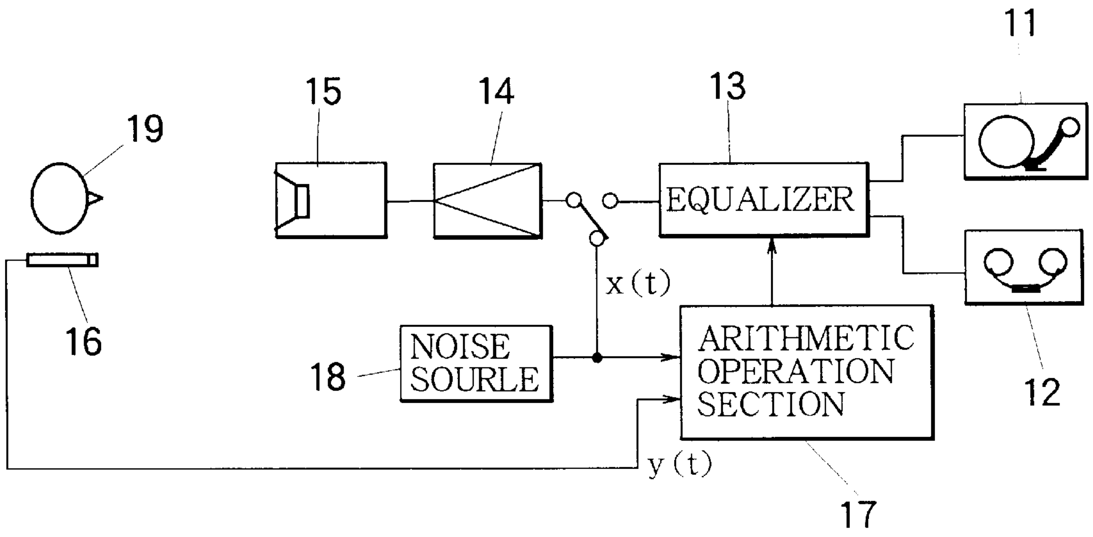
FIG.42 PRIOR ART
FIG. 42 is a diagram showing the configuration of the conventional acoustic replay device using an equalizer for characteristic correction.
Figure 43:
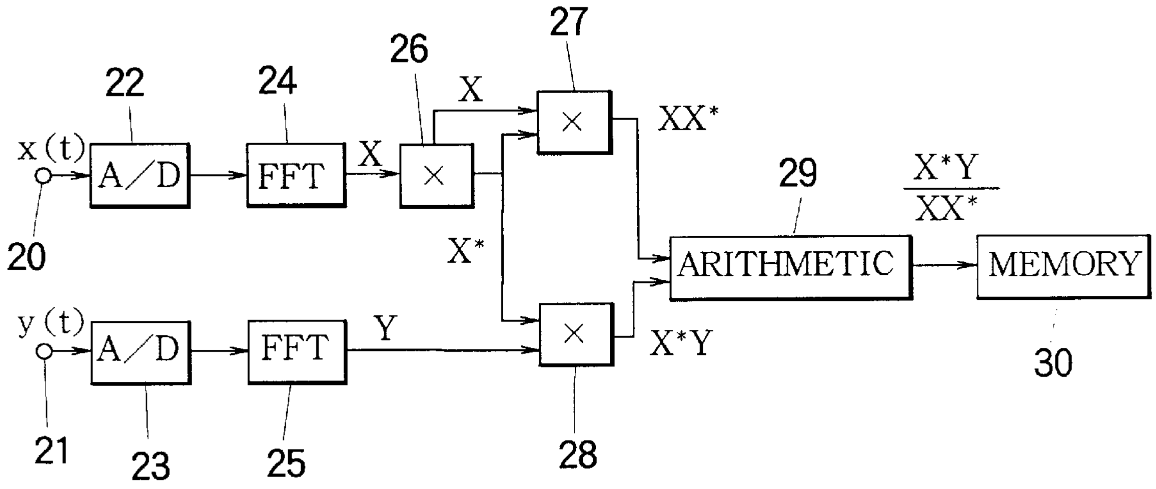
FIG. 43 PRIOR ART
FIG. 43 is a block diagram showing the configuration of a cross-spectrum calculating circuit in the conventional acoustic replay device.
Figure 44:
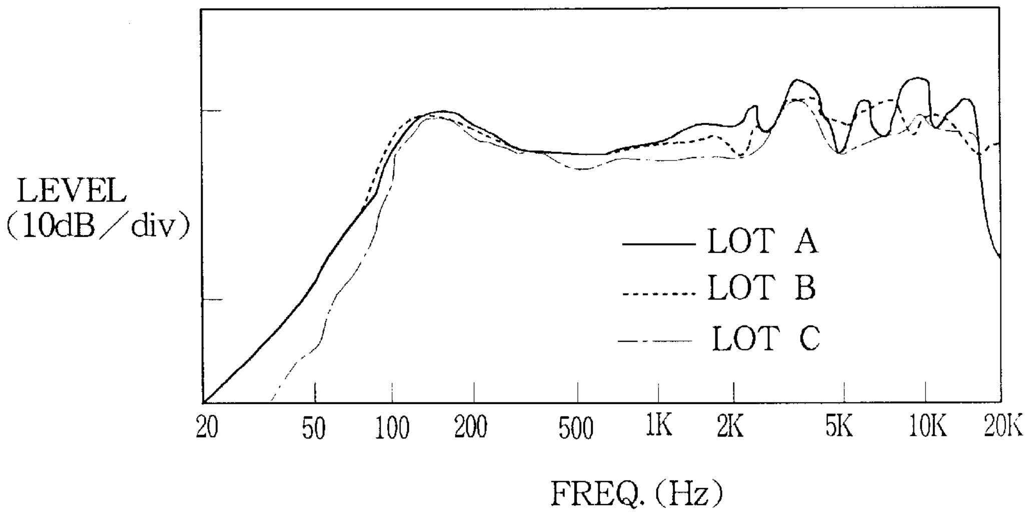
FIG. 44 PRIOR ART
FIG. 44 is a diagram showing the variation in the speaker characteristic between production lots.

When the audio signal is replayed by the speaker 4 having the replay characteristic shown in FIG. 37, the effect of the ducted horn 200 is removed from the radiation acoustic characteristic at the opening of the ducted horn 200 acting as the sound source for the sound field space, and, as shown in FIG. 2, the characteristic which is identical to the replay characteristic of the speaker 4 (FIG. 37) can be obtained.

Figure 45:
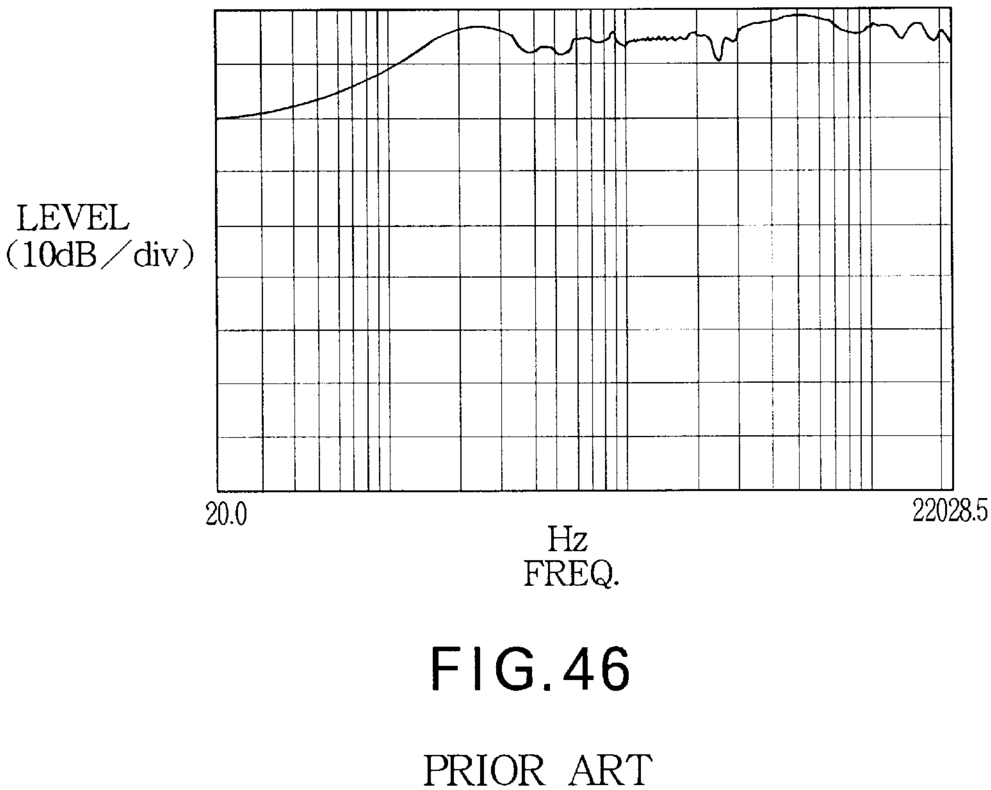
FIG.45 PRIOR ART
FIG. 45 is a diagram showing the replay characteristic of another speaker used in the conventional acoustic replay device.
Figure 46:
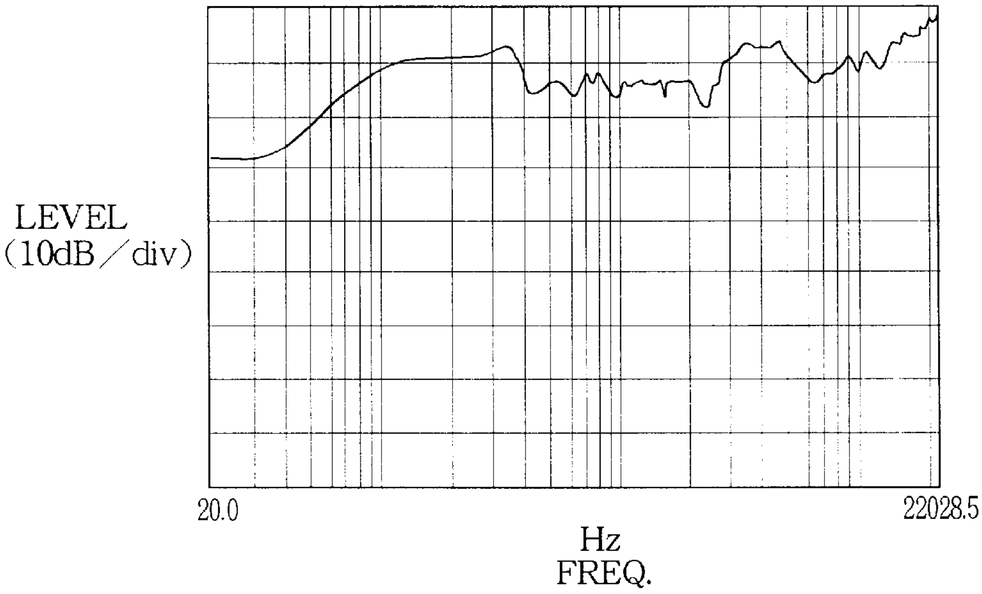
FIG.46 PRIOR ART
FIG. 46 is a diagram showing an example of listening characteristic in the case where the speaker of FIG. 45 is used.

In case of the acoustic replay device having the electro-acoustic transducer formed of the speaker with the characteristic shown in FIG. 45, which is different from the replay characteristic of FIG. 37, if the audio signal is replayed, because the non-recursive digital filter 2 has the transfer function H3, the radiation acoustic characteristic of the ducted horn opening, shown in FIG. 3, is free from the effect of the ducted horn 200, and is identical to the replay characteristic (FIG. 45) of the speaker 4 itself.

Embodiment 2

Figure 4:
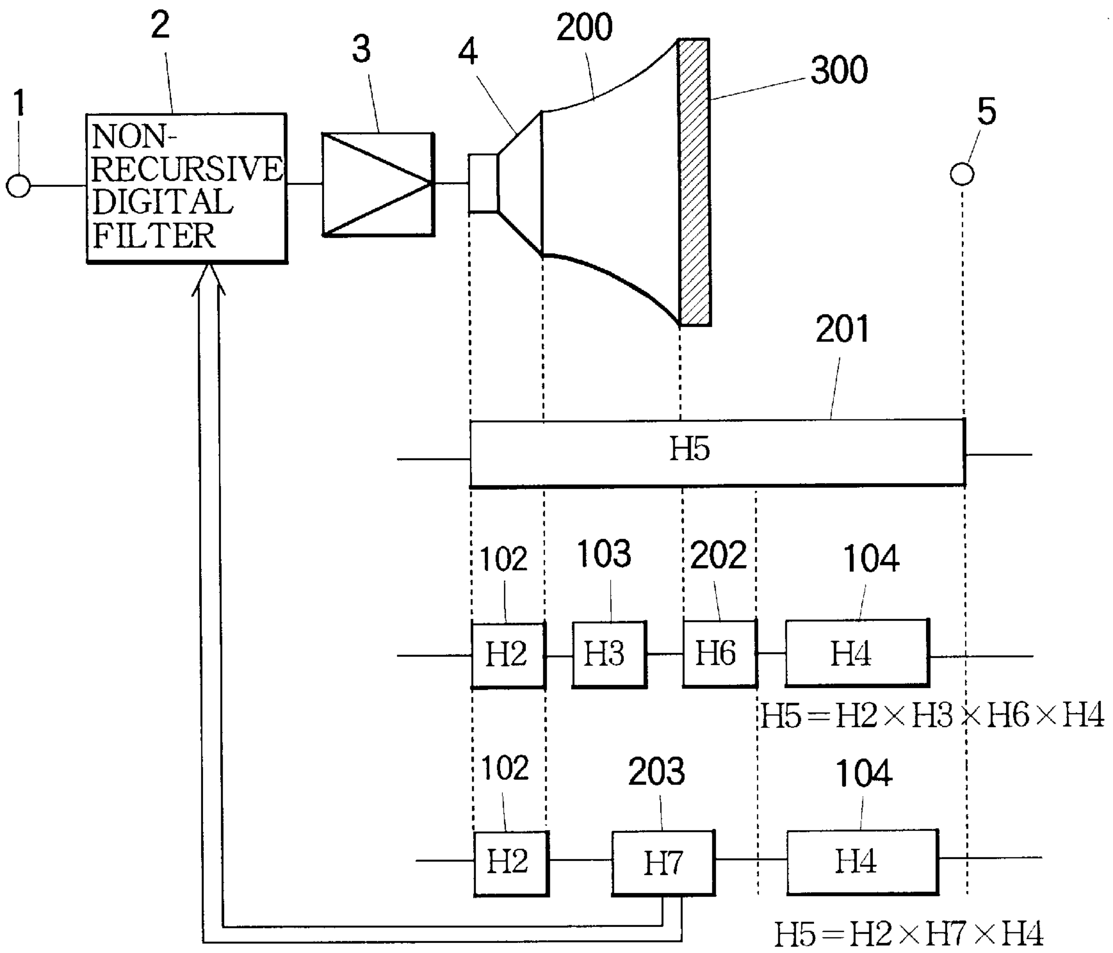
FIG. 4 is a diagram showing the configuration of a acoustic replay device of Embodiment 2 of the invention.

FIG. 4 shows the configuration of an acoustic replay device of Embodiment 2. In the drawing, reference numerals 1 to 5 and 200 denote members identical to those in the conventional device (FIG. 36), and their description is omitted. Reference numeral 300 denotes an acoustic resistance member having a transfer characteristic for degrading the high-frequency band of the acoustic radiation via the opening of the ducted horn 200. Transfer function H5 within block 201 represents the inverse characteristic of the total transfer characteristic of the speaker 4, the ducted horn 200, the acoustic resistance 300 and the space up to the listening position 5. Transfer function H2 within block 102 represents the inverse characteristic of the transfer characteristic of the speaker 4 alone, transfer function H3 within block 103 represents the inverse characteristic of the transfer characteristic of the ducted horn 200 alone, transfer function H6 within block 202 represents the inverse characteristic of the transfer characteristic of the acoustic resistance alone, and transfer function H4 within block 104 represents the inverse characteristic of the transfer characteristic of the acoustic space from the acoustic resistance 300 to the listening position 5. Transfer function H7 within block 203 represents the inverse characteristic of the total transfer characteristic of the ducted horn 200 and the acoustic resistance 300. The coefficient data of the non-recursive digital filter 2 is so set that the non-recursive digital filter 2 has the transfer function H7.

Figure 5:
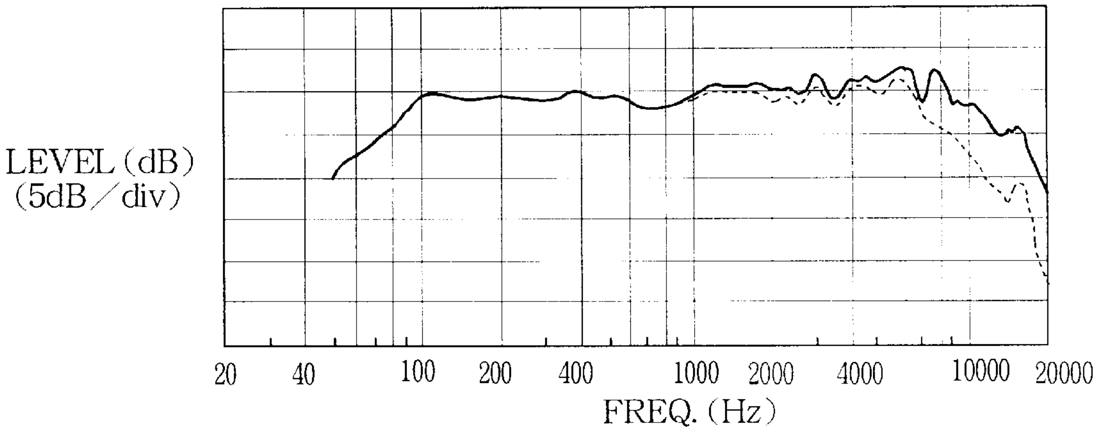
FIG. 5 is a diagram showing transfer characteristics with and without an acoustic resistance in Embodiment 2.
Figure 6:
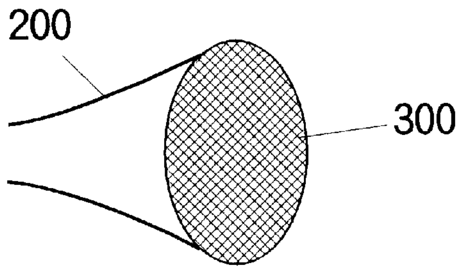
FIG. 6 is a perspective view of an example of acoustic resistance in Embodiment 2.
Figure 7:
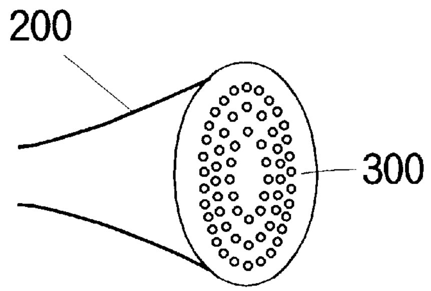
FIG. 7 is a perspective view of another example of acoustic resistance in Embodiment 2.
Figure 8:
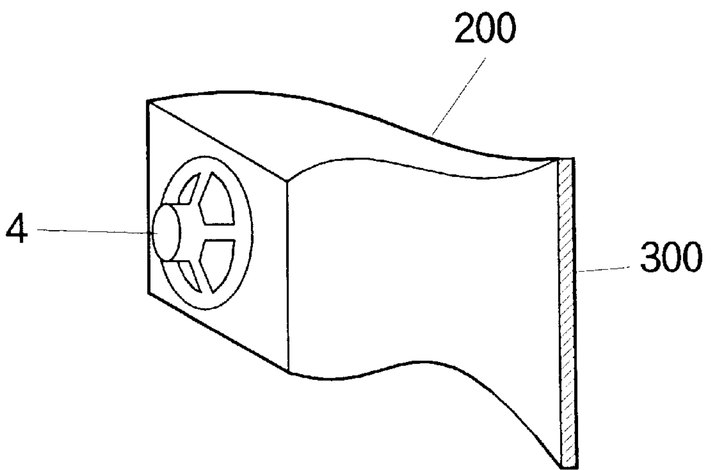
FIG. 8 is a perspective view of a further example of acoustic resistance in Embodiment 2.

FIG. 5 shows the effects of the acoustic resistance 300 on the transfer characteristic. That is, the solid line indicates the transfer characteristic without an acoustic resistance, and the dotted line indicates the transfer characteristic with an acoustic resistance. The acoustic resistance 300 has the function of degrading the acoustic power level in the high-frequency band of higher than 1000 Hz. The acoustic resistance 300 of this type can be formed of a thin cloth covering the opening of the ducted horn 200, as shown in FIG. 6, or a punching metal sheet with a multiplicity of fine perforations and covering the opening of the ducted horn 200, as shown in FIG. 7, or in the form of the acoustic resistance 300 obstructing the air flow by squeezing the area of the opening of the ducted horn 200.

The operation of the acoustic replay device will next be described. Like Embodiment 1, the audio signal received at the input terminal 1 is varied at the non-recursive digital filter 2 having the transfer function H7. The transfer function H7 of the non-recursive digital filter 2 serves to cancel the transfer characteristic of the ducted horn 200 and the acoustic resistance 300. The audio signal varied by the transfer characteristic of the non-recursive digital filter 2 is input to the power amplifier 3, where it is power-amplified, and then radiated, as the acoustic power, from the speaker 4 to the space, via the opening of the ducted horn 200 and the acoustic resistance 300. The radiated acoustic power has a characteristic which matches the replay characteristic of the speaker 4 itself.

Embodiment 3

Figure 9:
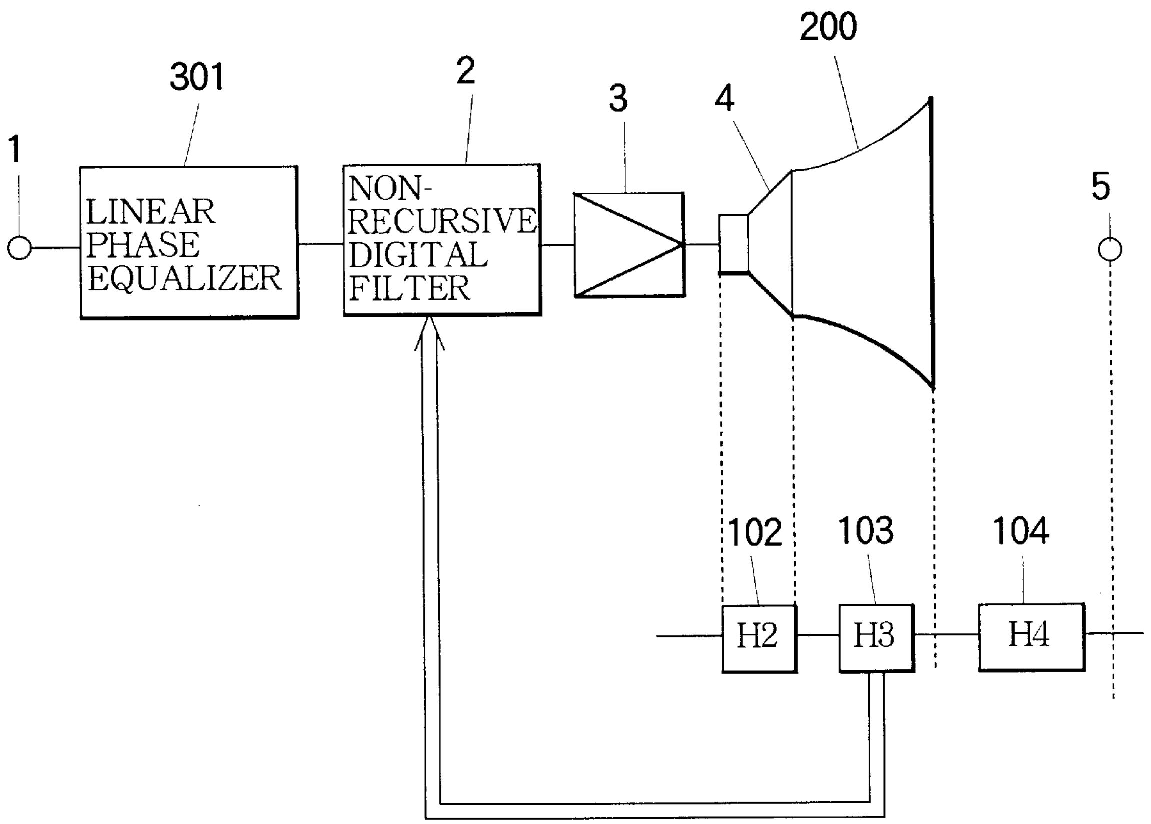
FIG. 9 is a diagram showing the configuration of an acoustic replay device in Embodiment 3 of the invention.

Embodiment 3 is an example of acoustic replay device with an improved amplitude characteristic, while maintaining the phase characteristic of the speaker. FIG. 9 shows the configuration of the acoustic replay device of Embodiment 3. In the drawing, reference numerals 1 to 5, 102 to 104 and 200 denote members identical to those in Embodiment 1 (FIG. 1), and their description is omitted. Reference numeral 301 denotes a linear phase equalizer provided in front of the non-recursive digital filter 2, and designed to alter the amplitude-frequency characteristic only, without altering the phase-frequency characteristic of the acoustic power radiated from the opening of the ducted horn 200.

Figure 10:
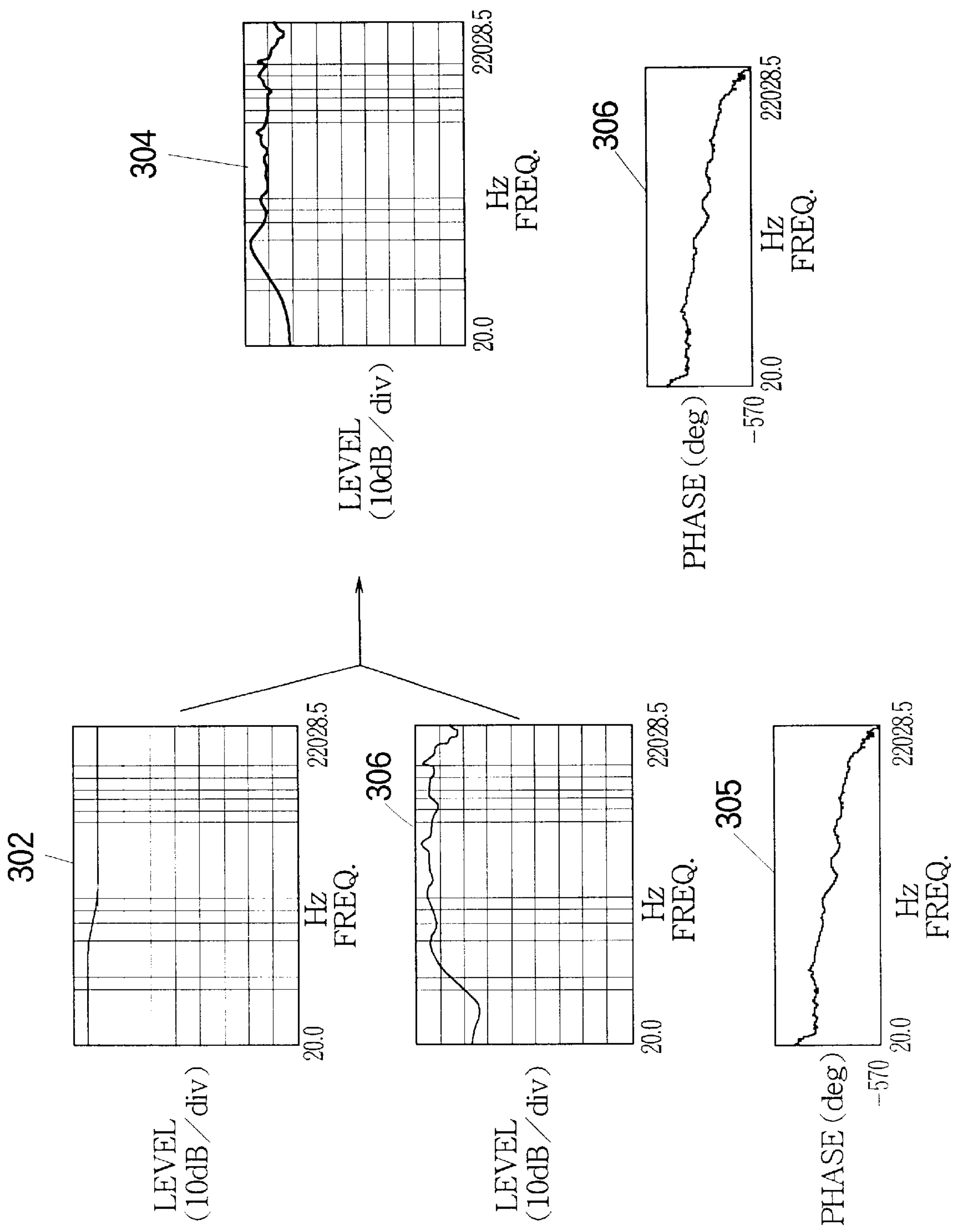
FIG. 10 is a diagram for explaining the effect of a linear phase equalizer in Embodiment 3.

FIG. 10 shows the radiation acoustic characteristic and the phase characteristic at the ducted horn opening, with the low-frequency sound replay capability being varied by the linear phase equalizer 301. Reference numeral 302 denotes the characteristic of the linear phase equalizer 301. Reference numeral 303 denotes the radiation acoustic characteristic at the ducted horn opening obtained when the linear phase equalizer 301 is not used. Reference numeral 304 denotes the radiation acoustic characteristic at the ducted horn opening obtained when the linear phase equalizer 301 is used. Reference numeral 305 denotes the phase characteristic at the ducted horn opening obtained when the linear phase equalizer 301 is not used. Reference numeral 306 denotes the phase characteristic at the ducted horn opening obtained when the linear phase equalizer 301 is used.

The operation of the acoustic replay device will next be described. Because the linear phase equalizer 301 varies the amplitude-frequency characteristic of the audio signal input via the input terminal 1, so that the acoustic power radiated via the opening of the ducted horn 200 has a characteristic which is varied with respect to the amplitude-frequency characteristic, rather than the replay characteristic of the speaker 4 as in Embodiment 1 or 2. The linear phase equalizer 301 alters the amplitude characteristic, without altering the phase characteristic, of the inverse characteristic of the ducted horn 200 determined by the non-recursive digital filter 2. The acoustic power radiated via the opening of the ducted horn 200 matches the phase characteristic of the speaker 4, and its amplitude characteristic is improved.

In the above description, it is assumed that the linear phase equalizer 301 is disposed in front of the non-recursive digital filter 2. The linear phase equalizer 301 may alternatively be disposed at the back of the non-recursive digital filter 2. The same effect can be obtained by the use of a digital filter having the total characteristic of the characteristic of the non-recursive digital filter 2 and the characteristic of the linear phase equalizer 301. In the above description, the improvement in the replay of the low-frequency band was made. A similar means can be utilized for improvement in all the frequency regions.

Embodiment 4

Embodiments 4 to 9, to be described next, relate to acoustic replay devices having adaptive signal processors for automatic correction of the sound pressure frequency characteristic at the listening position.

Figure 11:
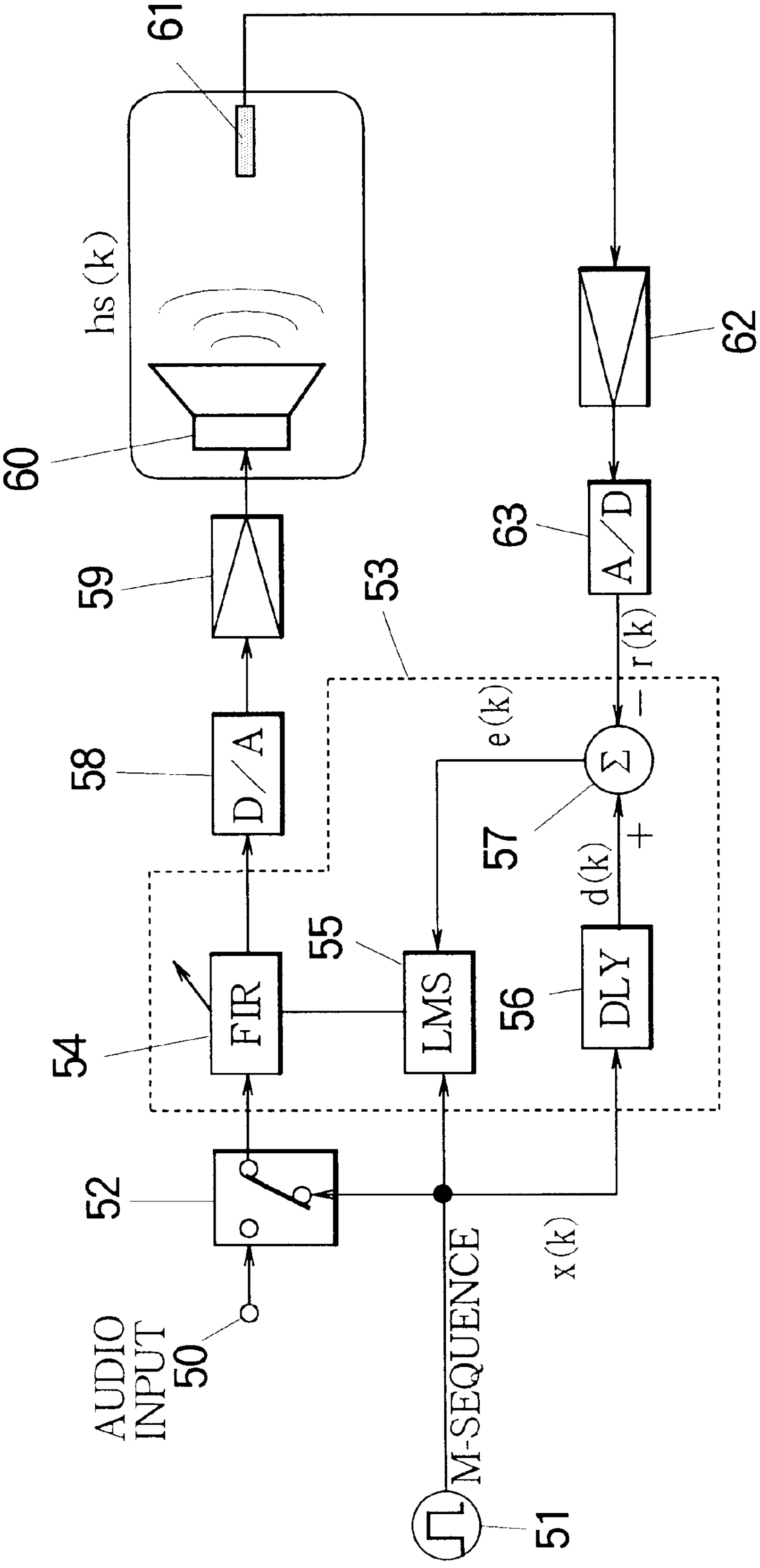
FIG. 11 is a diagram showing the configuration of an acoustic replay device in Embodiment 4 of the invention.

FIG. 11 shows the configuration of an acoustic replay device of Embodiment 4. In the drawing, reference numeral 50 denotes an audio signal input terminal, 51 denotes a noise source for generating an M-sequence signal as a noise, for example, 52 denotes a selector, and 53 denotes a coefficient data calculator for an inverse filter. The coefficient data calculator 53 is formed of an adaptive FIR (finite impulse response) digital filter 54, an arithmetic operation section 55 (called LMS arithmetic operation section 55) using LMS (least mean square) as an adaptive signal processing algorithm, a delay circuit 56 and an adder 57. Reference numeral 58 denotes a D/A converter, 59 denotes an amplifier, 60 denotes a speaker, 61 denotes a microphone, 62 denotes an amplifier, and 63 denotes an A/D converter.

The operation of the acoustic replay device will next be described. The coefficient data calculator 53 generates coefficient data for the inverse filter for the adaptive FIR digital filter in accordance with the adaptive signal processing algorithm, to be described later. For this purpose, the selector 52 is switched to the noise source 51 so that the M-sequence signal is passed through the adaptive FIR digital filter 54, the D/A converter 58 and the amplifier 59 to the speaker 60. The noise radiated from the speaker 60 is detected by the microphone 61 disposed at the listening position, and amplified by the amplifier 62, and passed through the A/D converter 63 and input to the coefficient data calculator 53. The coefficient data calculator 53 generates coefficient data for the inverse filter on the basis of the received signal r(k) and the M-sequence signal x(k) from the noise source 51.

The transfer function hs(k) is determined by the state of the sound field space from the speaker 60 to the microphone 61, and the transfer function of the electro-acoustic system including the sound field space is determined by the characteristic of the system from the selector 52, through the adaptive FIR digital filter 54, the D/A converter 58, the amplifier 59, the speaker 60, the microphone 61, the amplifier 62, and the A/D converter 63, and to the coefficient data calculator 53, and its inverse characteristic is realized as the transfer function of the adaptive FIR digital filter 54.

Figure 12:
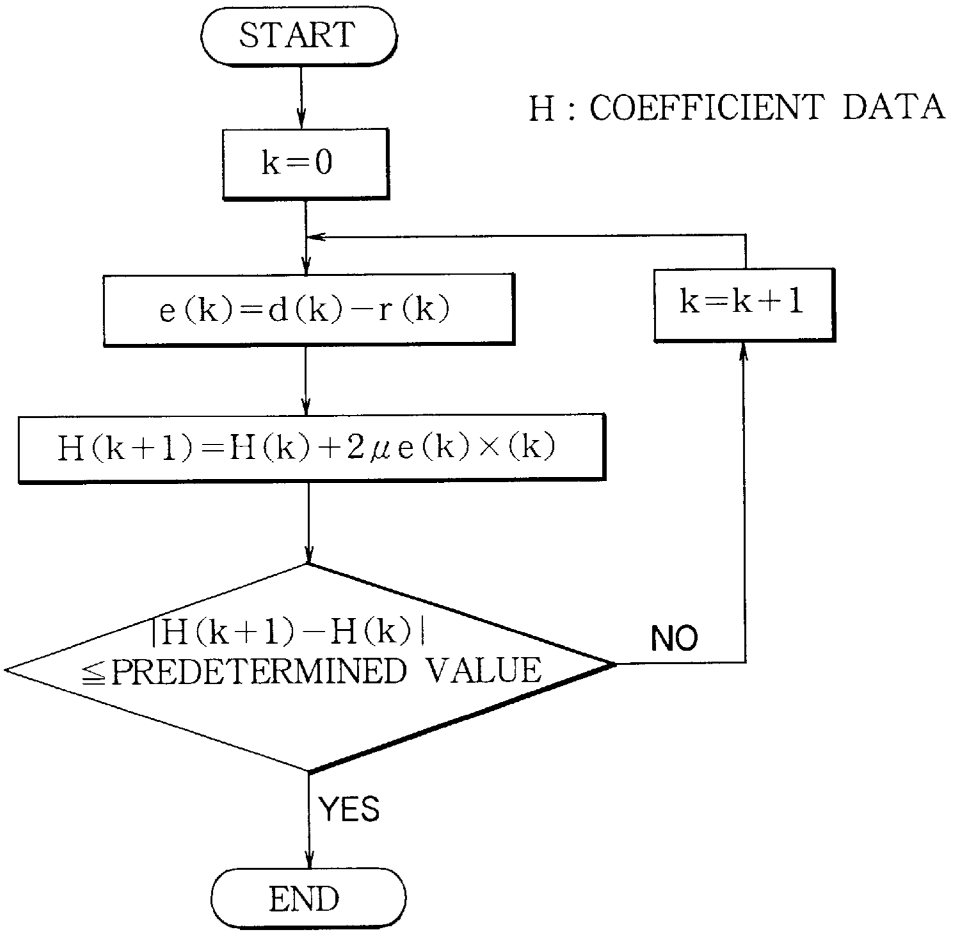
FIG. 12 is a flowchart showing the LMS algorithm.

FIG. 12 is a flowchart showing the procedure of calculation of the coefficient data in the coefficient data calculator 53. The received signal r(k) is input to the adder 57, after having its polarity reversed. The M-sequence signal from the noise source 51 is supplied to the adaptive FIR digital filter 54 via the selector 52, to the LMS calculator 55 as an LMS algorithm reference signal d(k), and to the adder 57 through the delay circuit 56. The delay time of the delay circuit 56 is so set that the inverse filter coefficient data can be specifically realized. That is, the delay circuit 56 compensates for the delay through the selector 52, FIR 54, D/A converter 58, the amplifier 59, the sound field space with the transfer function hs(k), the microphone 61, the amplifier 62 and the A/D converter 63, so that the output d(k) of the delay circuit 56 is in time with the output r(k) of the A/D converter 63.

The LMS calculator 55 receives the difference signal e(k) determined by the adder 57 receiving the received signal r(k) and the delayed M-sequence signal d(k), and repeatedly updates the coefficient data H, given by the following expression, on the basis of the error signal e(k) and the M-sequence signal x(k).

$$H(k+1)=H(k)+2\mu e(k)x(k)$$

The coefficient data H so determined is set in the adaptive FIR digital filter 54, and the updated until the convergence of the adaptive operation. As the criterion of convergence, it is judged that the adaptive operation has converged when the difference between H(k+1) and H(k) is smaller than a predetermined value. The coefficients $\mu$ in the above equation is the convergence coefficients inherent to the LMS algorithm, and the speed and the stability of convergence are controlled by this coefficient. When the adaptive operation has converged, the transfer function of the electro-acoustic system including the sound field space substantially matches the transfer function of the delay circuit 56. Accordingly, by the transfer function of the adaptive digital FIR filter 54, the inverse characteristic of the transfer function hs(k) of the electro-acoustic system from the speaker 60 to the microphone 61 can be realized. In other words, the inverse filter coefficient data H is automatically generated by the adaptive FIR digital filter 54.

Figure 13:
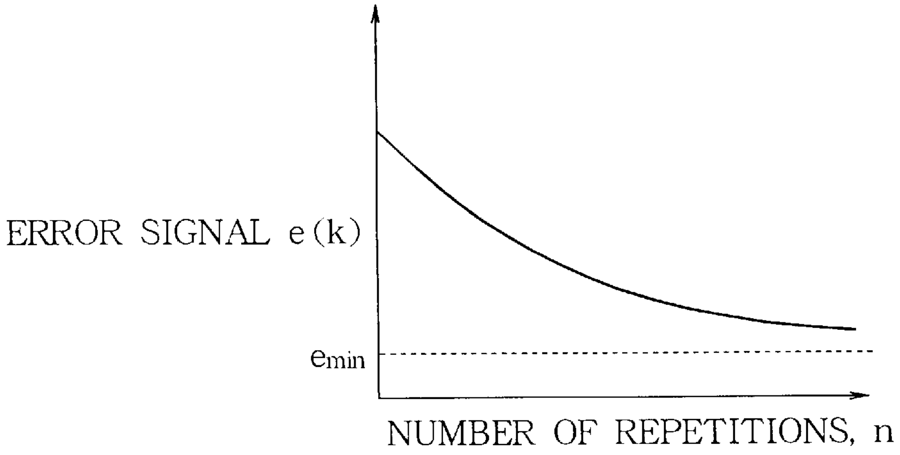
FIG. 13 is a diagram showing the process of convergence of the LMS algorithm.

FIG. 13 shows the process of convergence of the LMS algorithm. Because the error signal e(k) asymptotically approaches the minimum value $e_{min}$ by the repeated calculations, the difference between the coefficient data H(k) of the adaptive FIR digital filter 54 and its preceding value H(k−1) becomes small. After the convergence of the adaptive operation, the sound pressure frequency characteristic at the listening position is corrected using the inverse filter coefficient data generated by the adaptive FIR digital filter 54. For this purpose, the selector 52 is switched to select the signal from the sound input terminal 50. As a,result, the transfer function of the electro-acoustic system from the selector 52 to the microphone 61 is corrected, and a flat sound pressure frequency characteristic at the listening position can be realized.

In the above embodiment, the noise source 51 generating an M-sequence signal was used, but other noise source generating noise containing all the frequency band whose use is contemplated in the acoustic replay device, such as random noise, white noise, pink noise (1/f noise) or the like, can be used. The adaptive signal processing algorithm may not be limited to the LMS method, but filtered-X LMS method, a variation of the LMS algorithm, or the like may alternatively be used.

Embodiment 5

Figure 14:
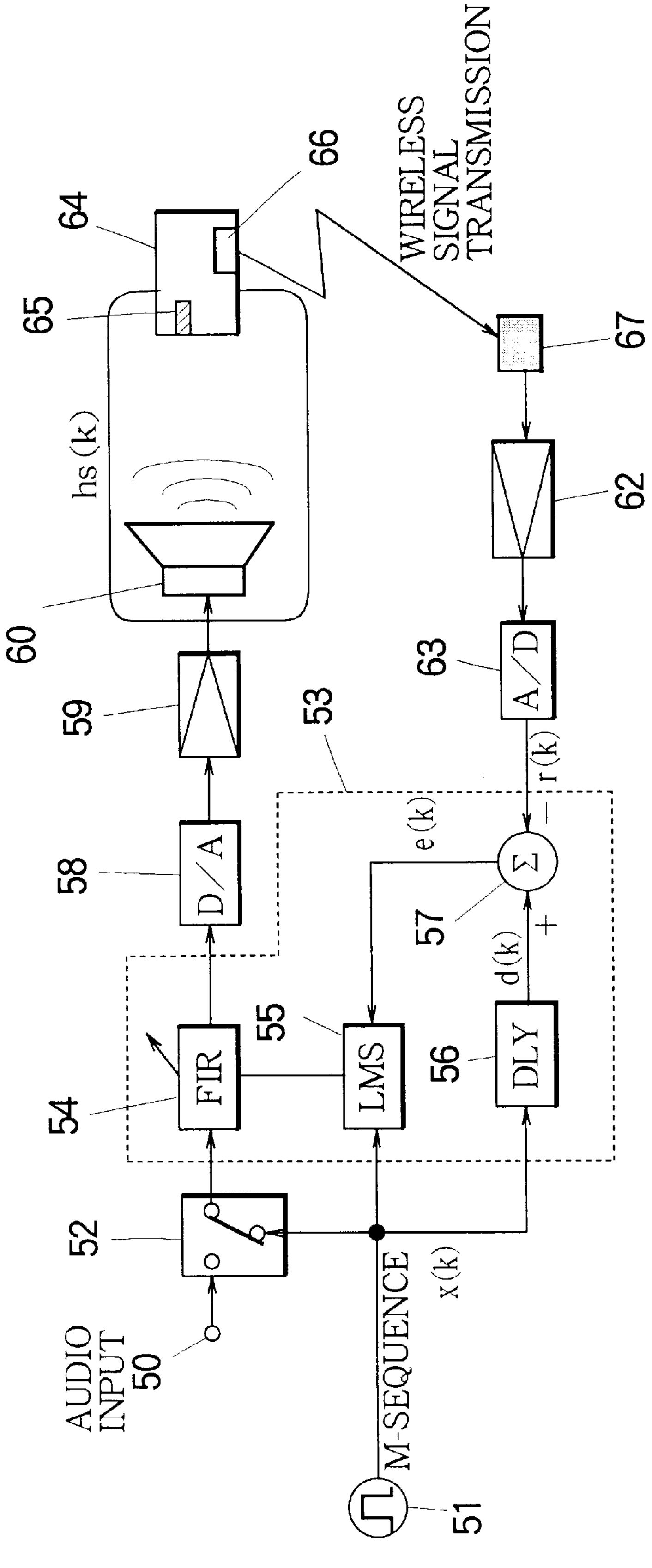
FIG. 14 is a diagram showing the configuration of an acoustic replay device in Embodiment 5 of the invention.

FIG. 14 shows the configuration of a acoustic replay device of Embodiment 5. In the drawing, reference numerals 50 to 63 denote members identical to those in Embodiment 4 (FIG. 11), and their description is omitted. Reference numeral 64 denotes a remote control unit provided with a microphone for detecting the acoustic level at the listening position. The remote control unit 64 is formed of the microphone 65 and the signal transmitting section 66 for transmitting the detected value without using connecting wire. Reference numeral 67 denotes a signal receiving section for receiving the transmitted detected value.

The operation of the above acoustic replay device is similar to that of Embodiment 4. A difference is that the M-sequence signal from the speaker 60, as detected by the microphone 65 is not directly used for the calculation, but is transmitted without using connecting wire from the signal transmitting section 66 in the remote control unit 64 to the signal receiving section 67, and is then used for the calculation.

The position at which the remote control unit 64 is disposed can be altered with ease, and where the acoustic level is detected after the listening position is altered arbitrarily, since the received signal r(k) is transmitted without using connecting wire, the calculation and resetting of the inverse filter coefficient data can be made with ease. Accordingly, the correction of the sound pressure frequency characteristic can be made efficiently.

Embodiment 6

Figure 15:
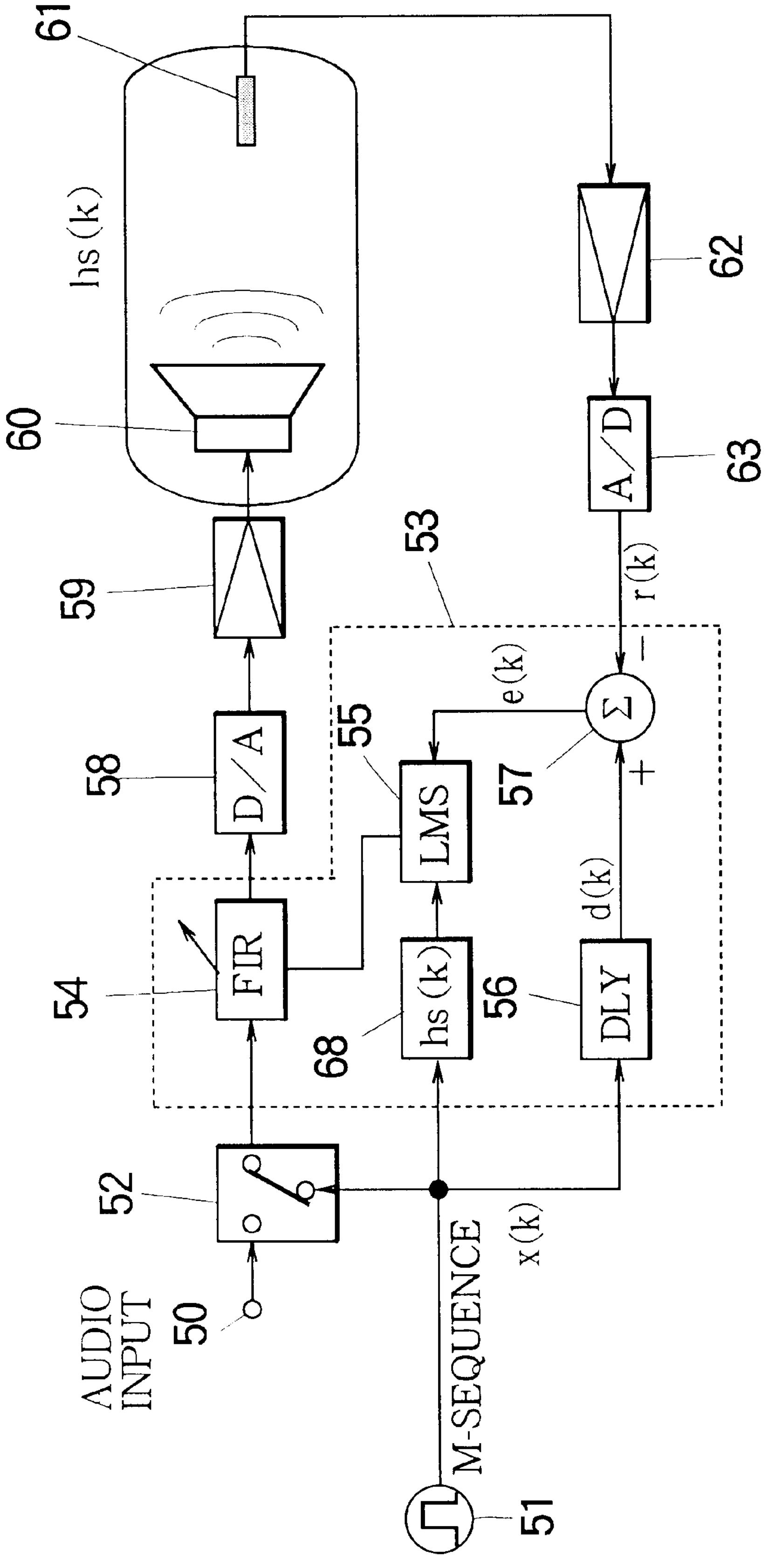
FIG. 15 is a diagram showing the configuration of an acoustic replay device in Embodiment 6 of the invention.

In Embodiment 6, the adaptive FIR signal processing algorithm used in the coefficient data calculator 53 is the filtered-X LMS method. FIG. 15 shows the configuration of the acoustic replay device of Embodiment 6. In the drawing, reference numerals 50 to 63 denote members identical to those in Embodiment 4 (FIG. 11), and their description is omitted. Reference numeral 68 denotes an arithmetic operation block which has the transfer function hs(k) of the acoustic system from the speaker 60 to the microphone 61 and is formed of a non-recursive digital filter (FIR filter).

The operation of the acoustic replay device for making correction of the sound pressure frequency characteristic at the listening position is basically identical to that in Embodiment 4. However, in Embodiment 6, the M-sequence signal is supplied via the arithmetic operation block 68 to the LMS calculator 55, so that the time for convergence of the adaptive operation is shortened, and the stability is improved.

Embodiment 7

Figure 16:
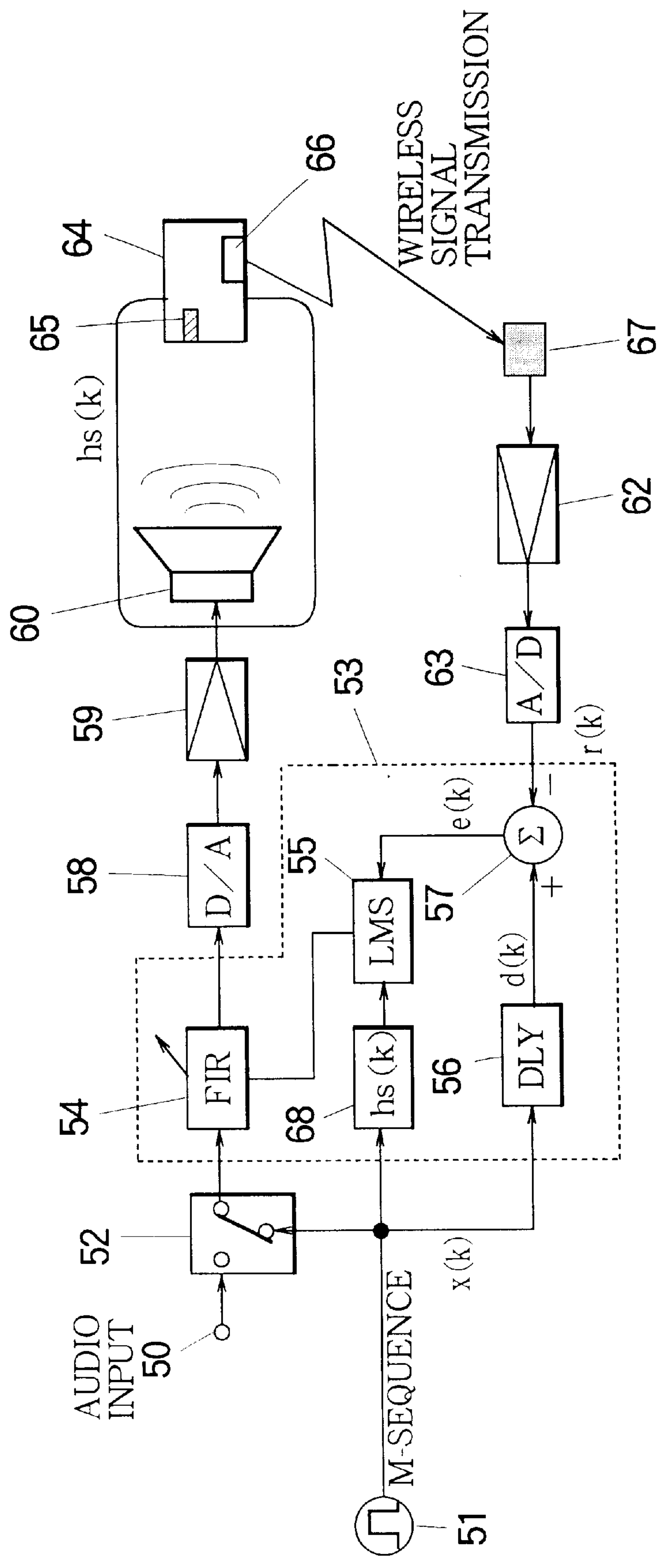
FIG. 16 is a diagram showing the configuration of an acoustic replay device in Embodiment 7 of the invention.

FIG. 16 shows the configuration of the acoustic replay device of Embodiment 7. This acoustic replay device uses the filtered-X LMS method, like Embodiment 6, as the adaptive signal processing algorithm in the inverse filter coefficient data calculator 53, and uses the remote control unit with a microphone to detect the acoustic level at the listening position.

With this acoustic replay device, it is therefore possible to efficiently achieve the stable adaptive operation and the inverse filter calculation.

Embodiment 8

Embodiment 8 is an acoustic replay device having, in addition to the adaptive FIR digital filter of the adaptive signal processor for generating the inverse filter coefficient data, an FIR digital filter for correcting the sound pressure frequency characteristic.

Figure 17:
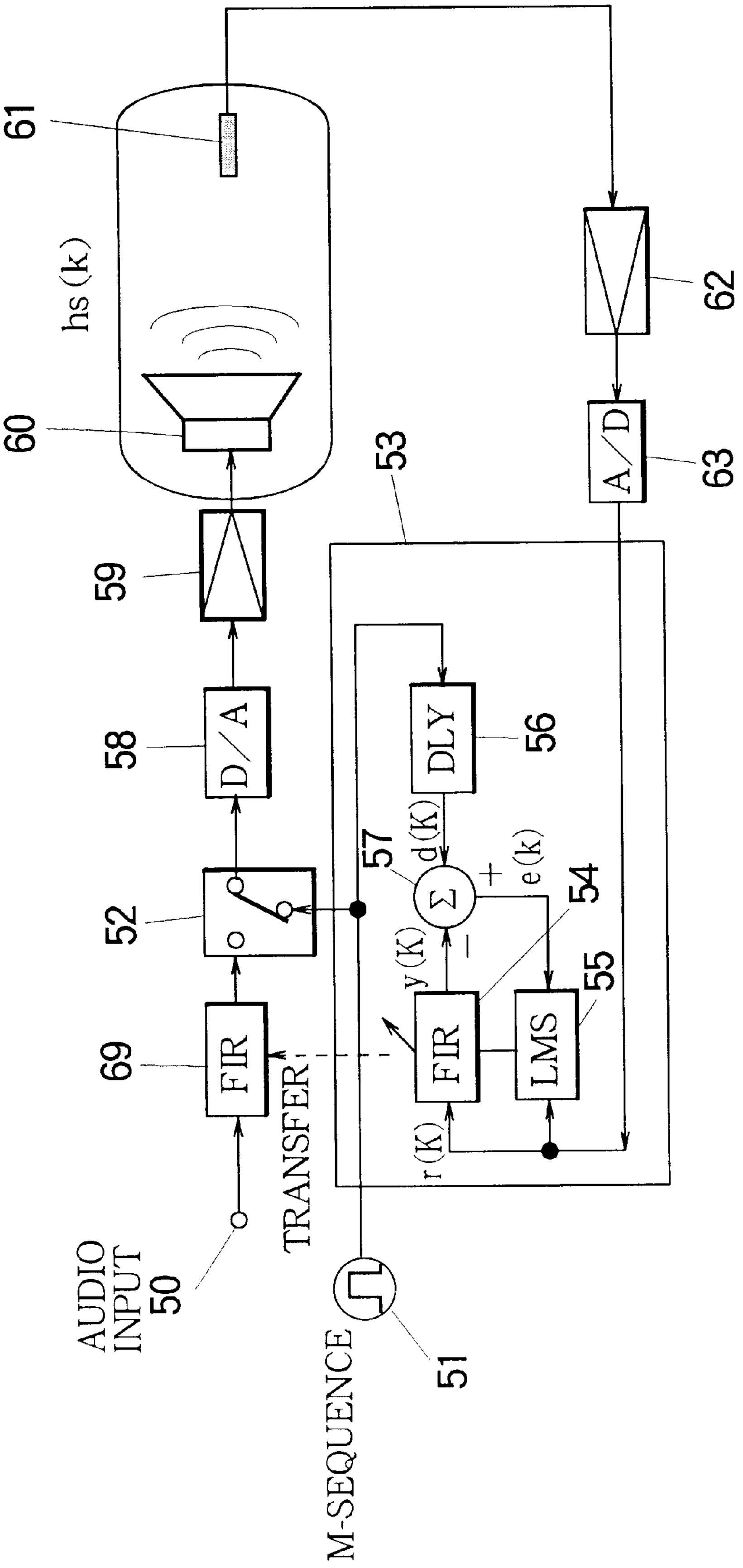
FIG. 17 is a diagram showing the configuration of an acoustic replay device in Embodiment 8 of the invention.

FIG. 17 shows the configuration of the acoustic replay device of Embodiment 8. In the drawing, reference numerals 50 to 63 denote members identical to those in Embodiment 4 (FIG. 11) and their description is omitted. Reference numeral 69 denotes an FIR digital filter separate from the FIR digital filter 54.

The operation of the above acoustic replay device will next be described. The coefficient data calculator 53 generates coefficient data for the inverse filter for the adaptive FIR digital filter in accordance with the adaptive signal processing algorithm, described above. For this purpose, the selector 52 is switched to the noise source 51 so that the M-sequence signal is passed through the D/A converter 58 and the amplifier 59 to the speaker 60. The noise radiated from the speaker 60 is detected by the microphone 61 disposed at the listening position, and amplified by the amplifier 62, and passed through the A/D converter 63 and input to the coefficient data calculator 53. In this coefficient data calculator 53, the input received signal r(k) is applied to the adaptive FIR digital filter 54 and the LMS calculator 55. The output y(k) of the adaptive digital FIR filter 54 is applied to the polarity-inverting input of the adder 57. The M-sequence signal from the noise source 51 is passed through the delay circuit 56 and applied to the adder 57. The delay time of the delay circuit 56 is preset at an arbitrary value so that the inverse coefficient data can be specifically realized, as in Embodiment 4. The LMS calculator 55 automatically updates the coefficient data to minimize the error signal e(k)=d(k)−y(k) calculated by the adder 57 by the LMS algorithm, using the received signal r(k) as a reference signal.

The transfer function hs(k) of the electro-acoustic system is determined by the characteristic of the system from the selector 52, through the D/A converter 58, the amplifier 59, the speaker 60, the microphone 61, the amplifier 62, the A/D converter 63, and the adaptive FIR digital filter 54 of the coefficient data calculator 53 to the adder 57, and its inverse characteristic is realized by the transfer function of the adaptive FIR digital filter 54.

When the adaptive operation has converged, the transfer function hs(k) of the electro-acoustic transducer substantially matches the transfer function of the delay circuit 56. Accordingly, the inverse characteristic of the transfer function hs(k) of the acoustic system from the speaker 60 to the microphone 61 is substantially realized by the transfer function of the adaptive FIR digital filter. In other words, the coefficient data for the inverse filter can be automatically generated in the adaptive digital filter 54.

When the adaptive operation has converged, the coefficient data generated by the adaptive FIR digital filter 54 of the coefficient data calculator 53 is transmitted to the FIR digital filter 69 for correcting the sound pressure frequency characteristic, and the selector 52 is switched to receive the signal from the input terminal 50. As a result, the transfer function of the electro-acoustic system from the speaker 60 to the microphone 61 is corrected, and a flat sound pressure frequency characteristic at the listening position is realized.

Embodiment 9

Figure 18:
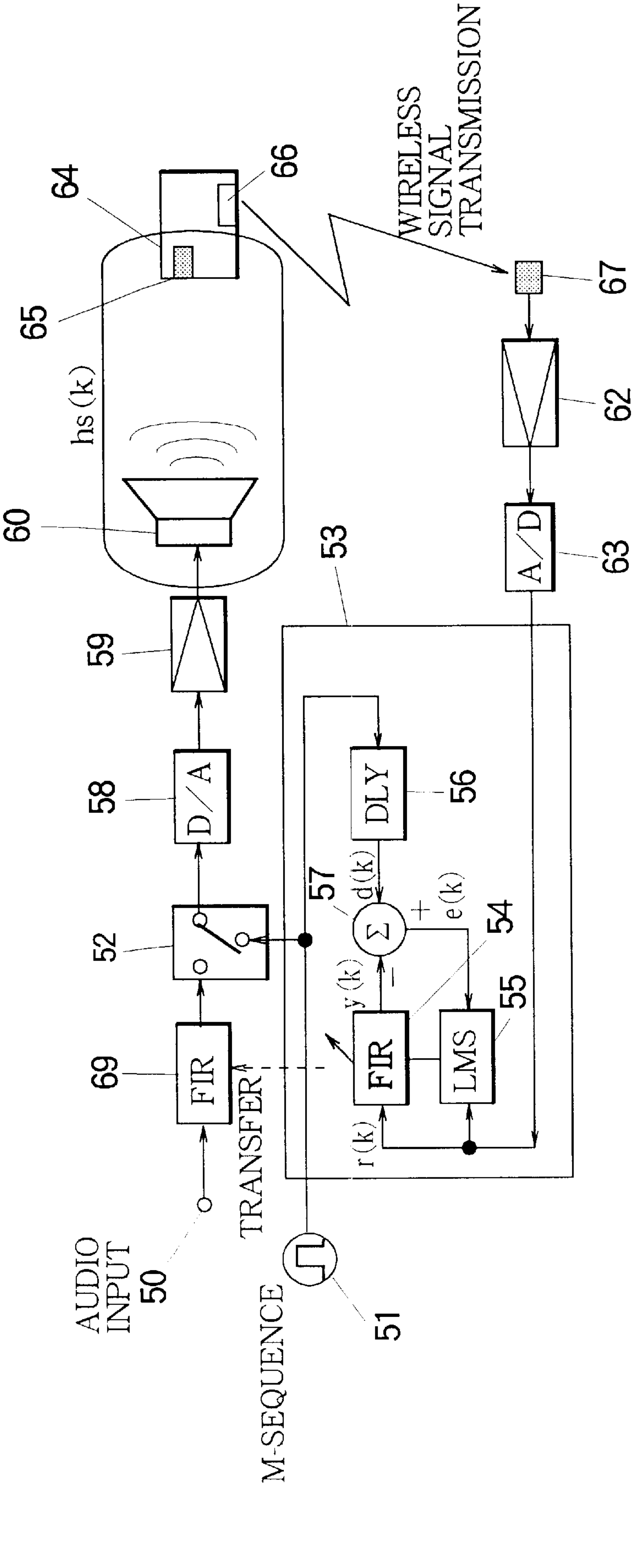
FIG. 18 is a diagram showing the configuration of an acoustic replay device in Embodiment 9 of the invention.

FIG. 18 shows the configuration of a acoustic replay device of Embodiment 9. This acoustic replay device uses the remote control unit with a microphone, like Embodiment 5, to detect the acoustic level at the listening position, and a digital filter for correcting the sound pressure frequency characteristic, in addition to the adaptive signal processor for generating the coefficient data.

With this acoustic replay device, it is therefore possible to efficiently achieve the stable adaptive operation and the calculation of the coefficient data.

Embodiment 10

Embodiments 10 to 12, to be described next, relate to acoustic replay devices in which the input analog audio signal is converted into a digital signal, and then processed, and in which the signal processing is altered depending on the output device.

Figure 19:
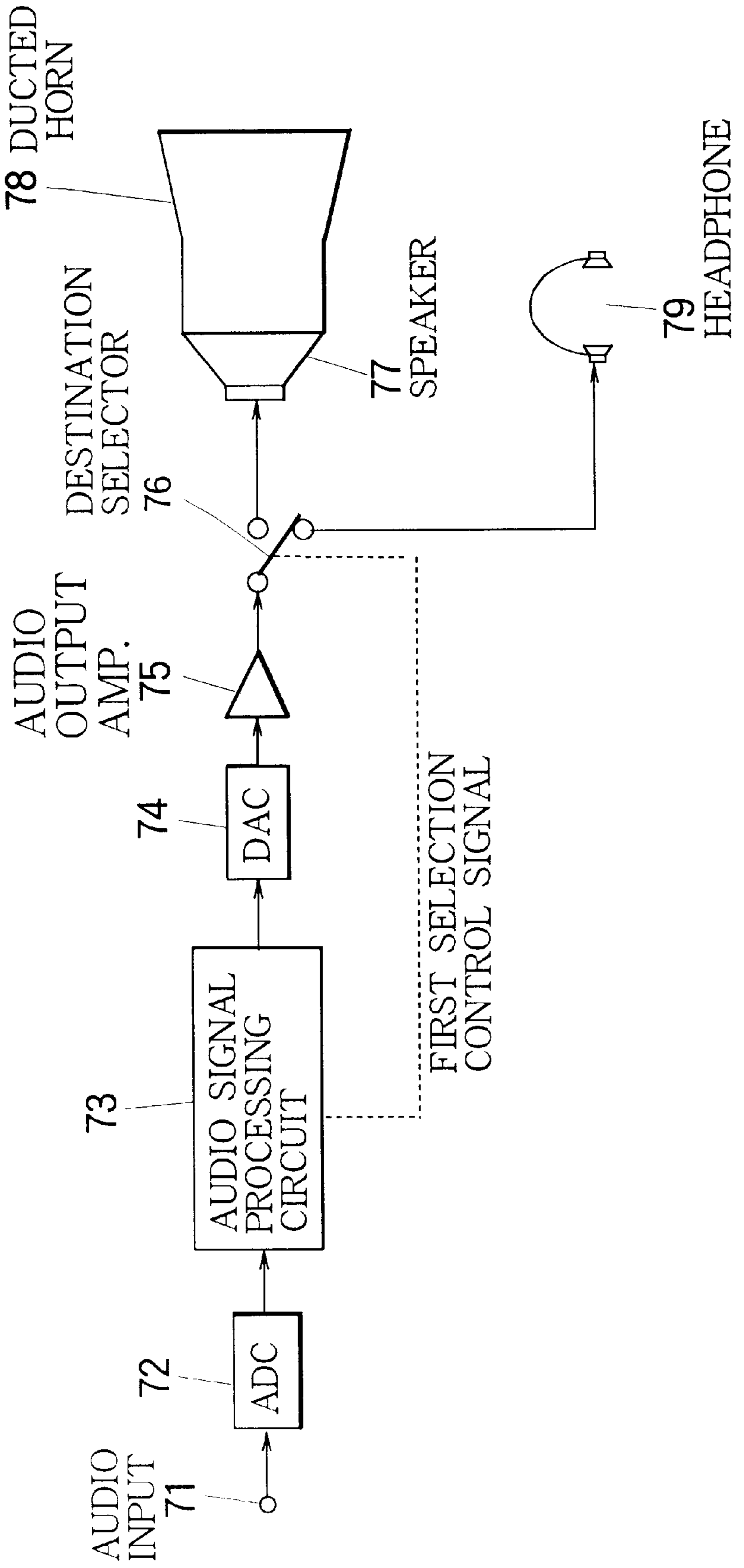
FIG. 19 is a diagram showing the configuration of an acoustic replay device in Embodiment 10 of the invention.

FIG. 19 shows the configuration of the acoustic replay device of Embodiment 10. Reference numeral 71 denotes an input terminal for receiving an analog audio signal, 72 denotes an A/D converter for converting the analog audio signal into a digital signal, 73 denotes an audio signal processing circuit which is capable of altering the replay characteristic, 74 denotes denotes a D/A converter for converting the digital signal into an analog signal, 75 denotes an audio output amplifier for converting the analog signal into a speaker drive signal, 76 denotes a destination selector for selecting the output device, 77 denotes a speaker, 78 denotes a ducted horn, and 79 denotes a headphone. The destination selector 76 operates to selectively connect the output of the audio output amplifier 75 to either the speaker 77 or to the headphone 79, and also produces a first selection control signal Sl, which assumes either of two states depending on whether the speaker 77 or the headphone 79 is selected. In accordance with the first selection control signal S1, the configuration within the non-recursive digital filter in the audio signal processing circuit 73 is switched.

Figure 20:
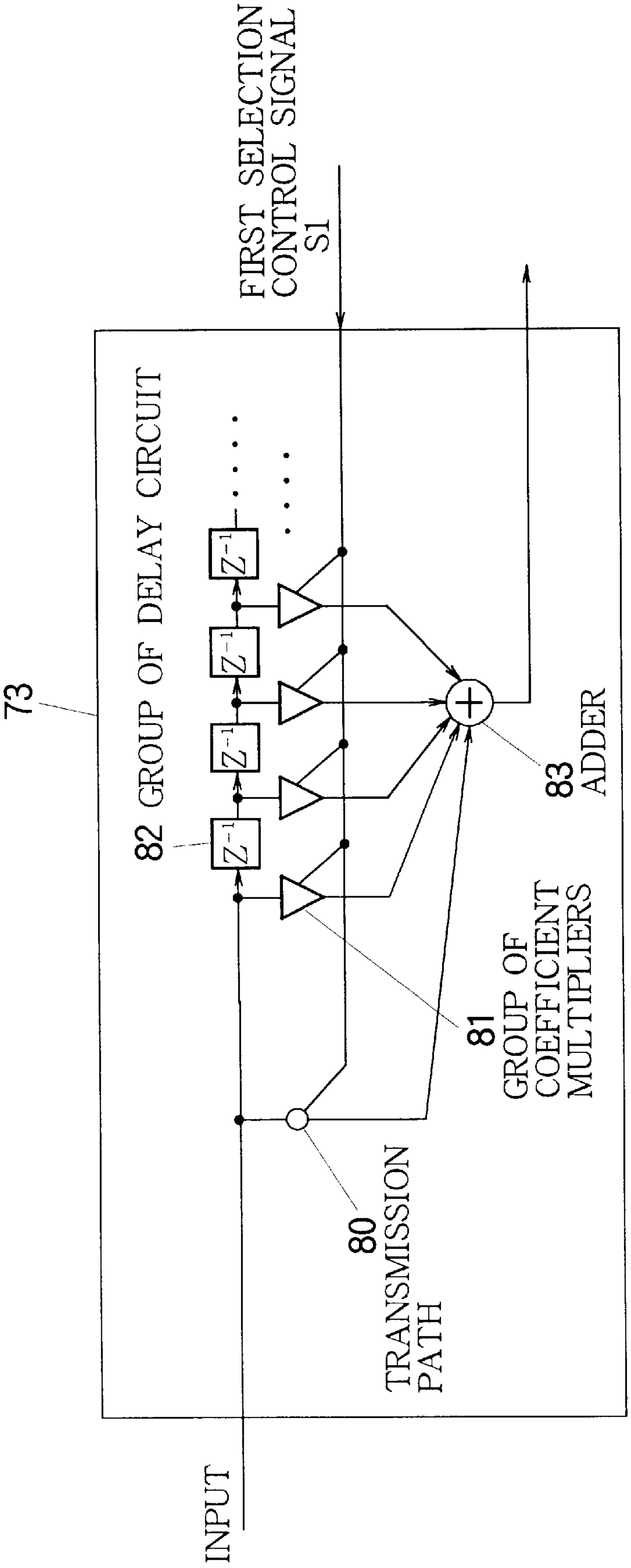
FIG. 20 is a block diagram showing an example of an audio signal processing circuit in Embodiment 10.

FIG. 20 shows an example of the audio signal processing circuit 73, which is configured as a non-recursive digital filter. Reference numeral 80 denotes a transmission path without an amplification factor and having a switch 80*a* provided in it, 81 denotes a group of coefficient multipliers for performing filter operation, 82 denote a group of delay circuits for delaying the input signal by one sample period, and 83 denotes an adder for adding the results of the operations at the coefficient multipliers 81. The first selection control signal Sl is altered together with the operation of the destination selector 76. It selectively controls the coefficient multipliers 81 and the switch 80*a* such that when the destination selector 76 selects the speaker 77, the results of the operations at the coefficient multipliers 81 are all input to the adder 83, and when the destination selector 76 selects the headphone 79, the output of the transmission path 80 alone is input to the adder 83.

The operation of the above acoustic replay device will next be described. The audio signal received at the input terminal 71 is converted into a digital signal by the A/D converter 72. The digital signal is processed at the audio signal processing circuit 73 so that it has a desired characteristic. The processed digital signal is converted into an analog signal. The analog signal is amplified by the audio output amplifier 75, and supplied to the device selected by the destination selector 76.

When the destination selector 76 selects the speaker 77, the first selection control signal S1 controls the audio signal processing circuit 73 such that the results of the calculations at the coefficient multipliers 81 are supplied to the adder 83, and the characteristic set in advance are convolved in the input signal, and the result of the arithmetic operation is supplied from the adder 83 to the D/A converter 74. When the destination selector 76 selects the headphone 79, the first selection control signal S1 controls the audio signal processing circuit 73 such that the output of the transmission path 80 alone is supplied to the adder 83, and a signal for driving the headphone 79 is formed without altering the characteristic, and is supplied via the adder 83 to the D/A converter 74.

In this embodiment, the headphone 79 is used as an output device other than the speaker 77. But another speaker system may be used. Moreover, the arrangement may be such that replay with the speaker 77, without alteration of characteristic by the audio signal processing circuit 73 can be selected.

In the above embodiment, the transmission path 80 is provided at the input side of the audio signal processing circuit 73. It may alternatively be provided at a position where the delay time is half the total delay time obtained by the group of delay circuits 82, or any other position of an arbitrary delay.

In the acoustic replay device of Embodiment 10, in order to transmit the audio signal, the transmission path 80 separate from the paths for arithmetic operation on the correction characteristic is provided in the audio signal processing circuit 73. As a result, replay with an electro-acoustic transducer, such as a headphone 79, other than the speaker 77, can be conducted without altering its characteristic. When the acoustic replay device has a correction characteristic for a certain speaker 77, replay with other electro-acoustic transducer can be achieved with a high fidelity, without disturbing the replay characteristic of such other electro-acoustic transducer.

By providing the transmission path 80 at a position where the delay is one half the total delay time of the delay circuit group 82, the amount of delay in the audio signal processing circuit 73 is not changed when the output (destination) is switched from one to another, and the switching is effected smoothly.

Embodiment 11

Figure 21:
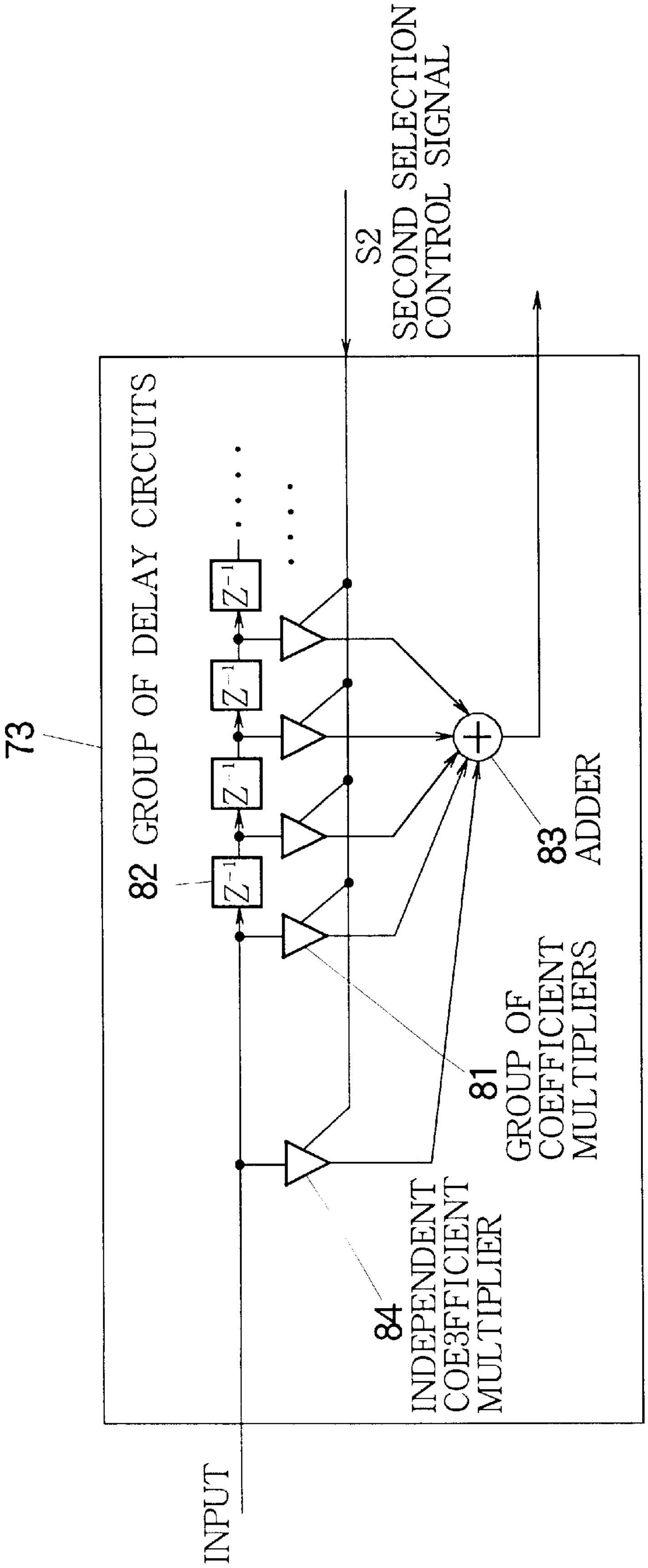
FIG. 21 is a block diagram showing an example of an audio signal processing circuit in Embodiment 11 of the invention.

FIG. 21 shows an example of an audio signal processing circuit of Embodiment 11. In the drawing, the general configuration of the acoustic replay device is identical to that of Embodiment 10 (FIG. 19 and FIG. 20), and the members 81 to 83 in the audio signal processing circuit 73 are identical to members of identical reference numerals in Embodiment 10 (FIG. 19 and FIG. 20), and their description is omitted. A difference from the circuit of Embodiment 10 is a separate coefficient multiplier 84 having a coefficient, and independent from the coefficient multipliers 81 of the non-recursive digital filter. A second selection control signal S2 controls the coefficient multipliers 81 and 84 such that the results of the calculations at the coefficient multipliers 81 are supplied to the adder 83 when the destination selector 76 selects the speaker 77, while the output of the coefficient multiplier 84 alone is supplied to the adder 83 when the destination selector 76 selects the headphone 79.

The operation of the acoustic replay device will next be described. When the destination selector 76 selects the speaker 77, the second selection control signal S2 controls the audio signal processing circuit 73 such that the results of the calculations at the coefficient multipliers 81 are input to the adder 83, and the characteristic set in advance is convolved in the input signal, and the result of the calculation is supplied to the D/A converter 74. When the destination selector 76 selects the headphone 79, the second selection control signal S2 controls the audio signal processing circuit 73 such that the output of the independent coefficient multiplier 84 alone is supplied to the adder 83, and the input signal is multiplied with the coefficient at the independent coefficient multiplier 84, and the signal for driving the headphone is formed, and is supplied to the D/A converter 74. An arbitrary coefficient is used for the multiplication at the independent coefficient multiplier 84. When the acoustic replay device having a predefined correction characteristic is used with a different electro-acoustic transducer, the audio signal having its amplitude adjusted and not being corrected can be obtained, and an audio signal having its amplitude level adjusted can be obtained without disturbing the replay characteristic. In the embodiment described, the independent coefficient multiplier 84 is provided on the input side of the audio signal processing circuit 73. The arrangement may alternatively be such that the independent coefficient multiplier 84 is provided at the position where the delay time is half the total delay time of the delay circuit group 82, or at a position of an arbitrary signal delay.

Embodiment 12

Figure 22:
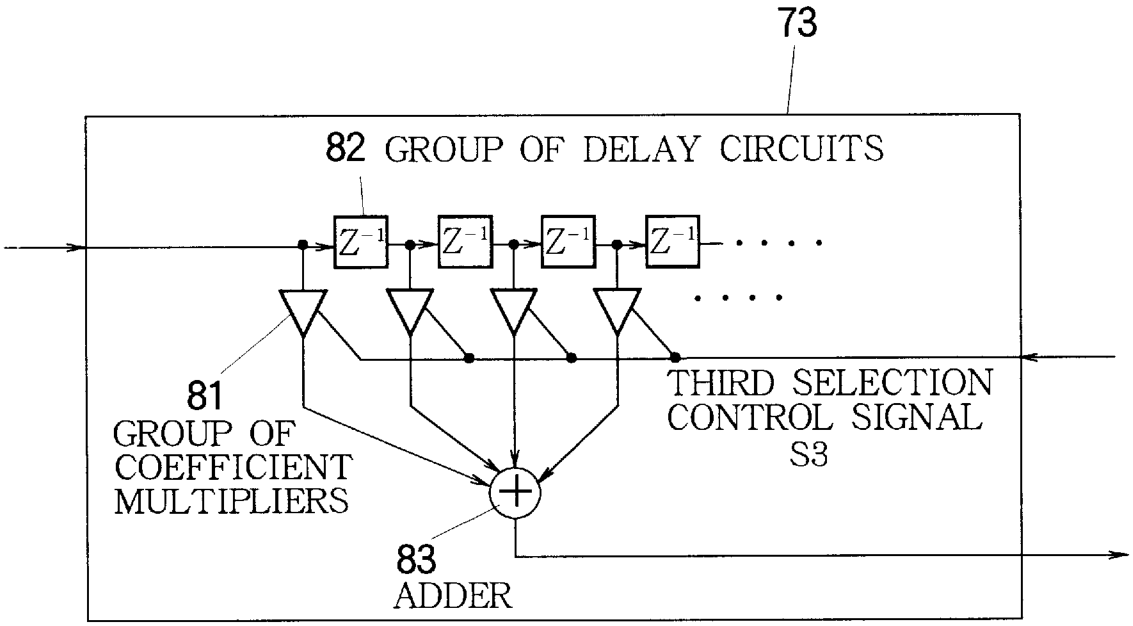
FIG. 22 is a block diagram showing an example of an audio signal processing circuit in Embodiment 12 of the invention.

FIG. 22 is a block diagram showing an example of an audio signal processing circuit in Embodiment 12. In the drawing, reference numerals 81 to 83 denote members identical to those with identical reference numerals in the audio signal processing circuit of Embodiment 11 (FIG. 21), and their description is therefore omitted. A difference from the circuit of Embodiment 11 is that the separate transmission path is not provided, and a third selection control signal S3 is used to switch the configuration of the non-recursive digital filter in the audio signal processing circuit 73.

The operation of the acoustic replay device will next be described. When the destination selector 76 selects the speaker 77, the selection control signal S3 controls the audio signal processing circuit 73 such that the results of the calculations at the coefficient multipliers 81 are supplied to the adder 83, whereby the predefined characteristic is convolved in the input signal, and the result of the calculation is supplied form the adder 83 to the D/A converter 74. When the destination selector 76 selects the headphone 79, the third selection control signal S3 controls the audio signal processing circuit 73 such that an output of one of the coefficient multipliers 81 is supplied to the adder 83, and the input signal is multiplied with the coefficient at the selected one of the coefficient multipliers 81, and a signal for driving the headphone 79 is formed without altering the characteristic, and is supplied from the adder 83 to the D/A converter 74. In this way, without providing a transmission path other than the audio signal processing circuit 73, the audio signal without correction can be output. Accordingly, the audio signal can be replayed with a high fidelity using the acoustic replay device having a correction characteristic for the speaker 77, and without disturbing the replay characteristic of such other electro-acoustic transducer.

Embodiment 13

Figure 47:
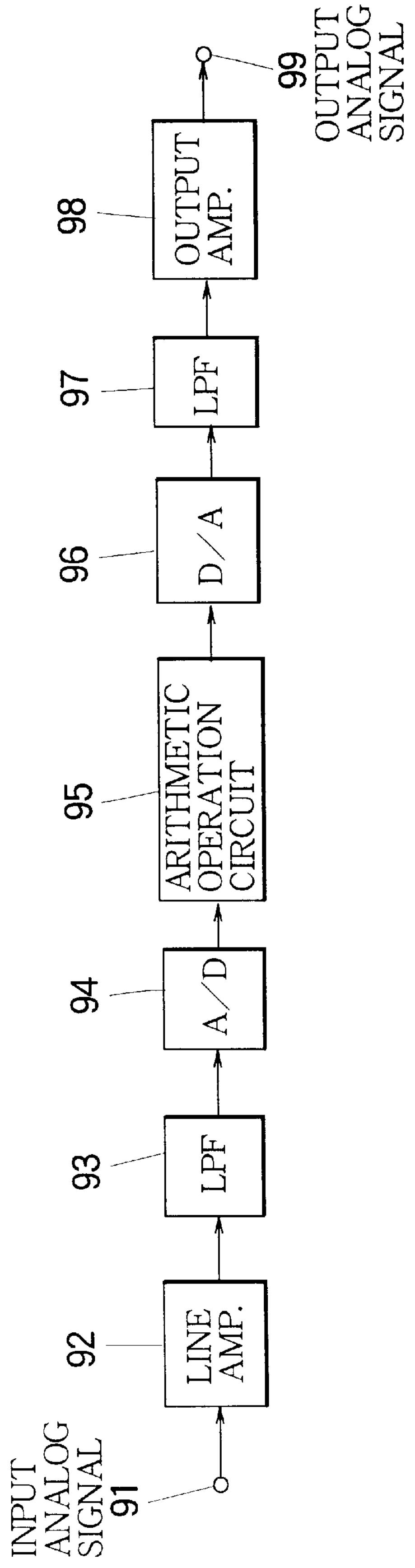
FIG. 47 PRIOR ART
FIG. 47 is a block diagram showing the configuration of a conventional signal processing device processing a digital signal.
Figure 48:
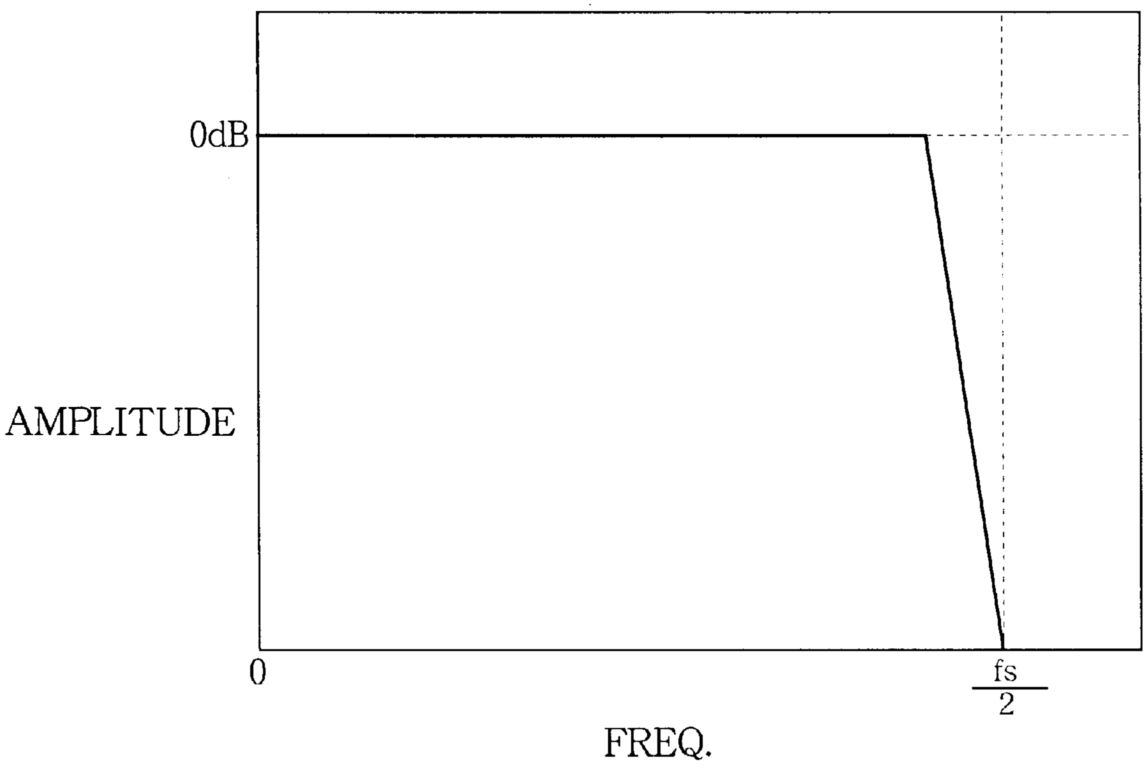
FIG. 48 PRIOR ART
FIG. 48 is a diagram showing a transfer characteristic in the conventional signal processing device.

Embodiments 13 to 16, to be described next, relate to acoustic replay devices in which the audio signal can be replayed by a variety of output devices, without dropping any of the input analog signal frequency components. These embodiments are for eliminating the problems of the prior art of FIG. 47 and FIG. 48.

Figure 23:
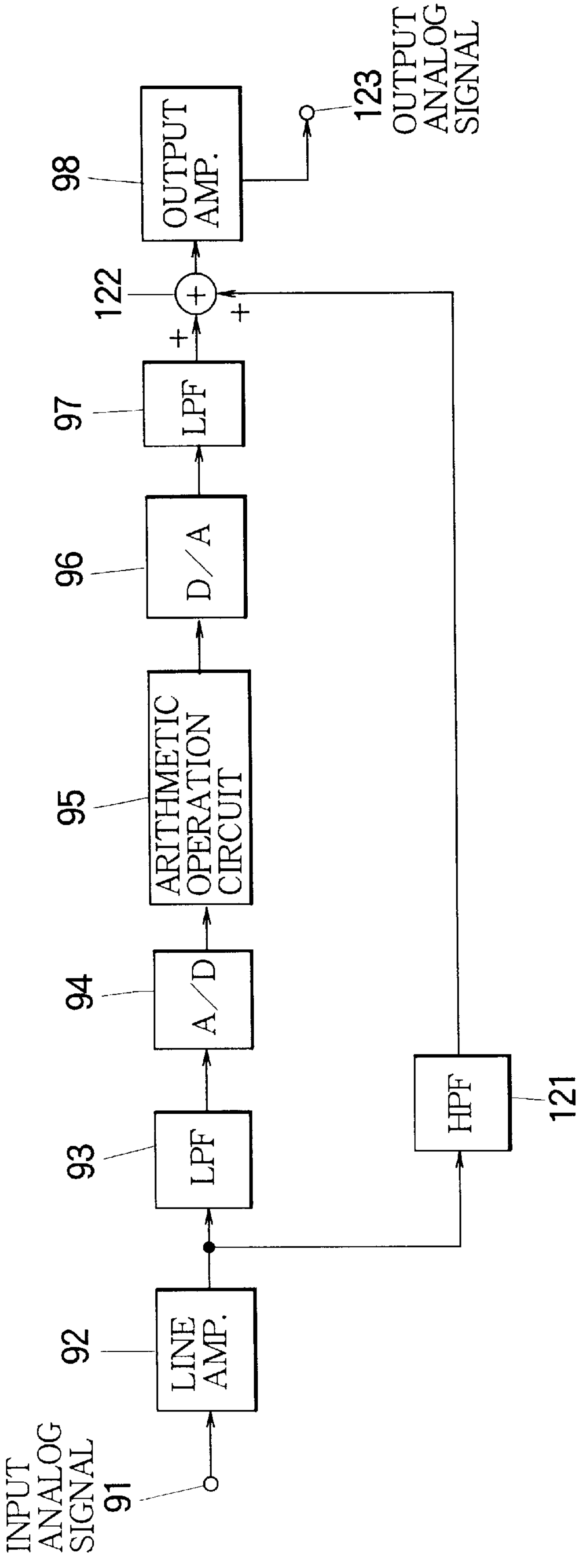
FIG. 23 is a block diagram showing the configuration of in Embodiment 13 of the invention.

FIG. 23 shows the configuration of the acoustic replay device of Embodiment 13. In the drawing, reference numerals 91 to 98 denote members identical to those in FIG. 47, and their description is omitted. Reference numeral 121 denotes a high-pass filter connected via the line amplifier 92 to the input terminal 91. The high-pass filter 121 extracts signal components of the high frequencies which are above the frequency band handled by the arithmetic operation processing circuit 95. Reference numeral 122 denotes a first adder connected to the second low-pass filter 97 and the high-pass filter 121, to add the signal components extracted by the high-pass filter 121 to the analog signal processed by the arithmetic operation processing circuit 95 and then D/A-converted. Reference numeral 123 denotes an output terminal for outputting the result of the addition at the adder 122 via the output amplifier 98.

Figure 24:
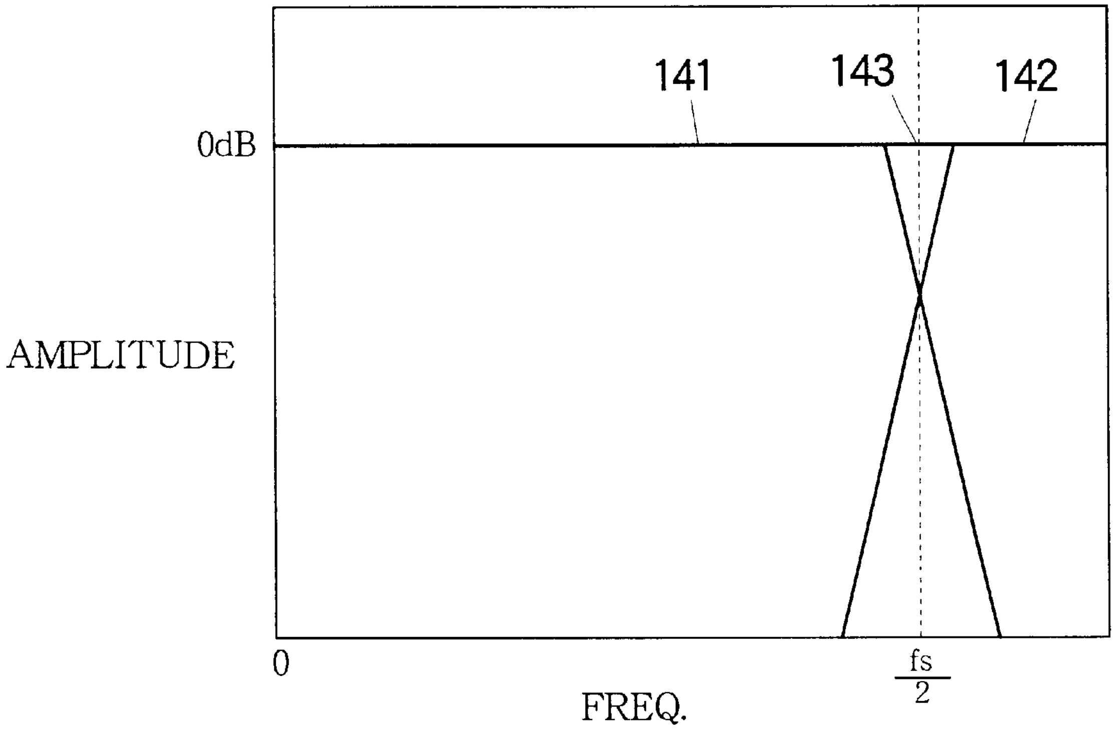
FIG. 24 is a diagram showing the transfer characteristic of low-pass and high-pass filters in Embodiment 13.

FIG. 24 shows the transfer characteristic of the low-pass filter and the high-pass filter in FIG. 23. Reference numeral 141 denotes an amplitude characteristic of the first low-pass filter 93, and reference numeral 142 denotes an amplitude characteristic of the high-pass filter 121. The frequency components below fs/2 are contained in the signal having the amplitude characteristic 141, while the frequency components above fs/2 are contained in the signal having the amplitude characteristic. The amplitude characteristic of the signal obtained by the addition of the outputs of the two filters 93 and 121 is flat, as indicated by the synthetic characteristic 143.

The operation of the acoustic replay device of Embodiment 13 will next be described.

The analog signal received at the input terminal 91 is passed through the line amplifier 92 and input to the first low-pass filter 93 and the high-pass filter 121. The analog signal band-limited by the first low-pass filter 93 is passed through the A/D converter 94, the arithmetic operation processing circuit 95, the D/A converter 96, and the second low-pass filter 97 and output as the analog signal having been subjected to arithmetic operation. The analog signal passing through the high-pass filter 121 is the signal having the frequency-band components which are removed by the first low-pass filter 93. By adding the analog signal having been subjected to the digital arithmetic operation, and the analog signal from the high-pass filter 121 at the adder 122, the signal of flat amplitude characteristic 143 in FIG. 24 is obtained. The output signal containing all the frequency components of the input analog signal is therefore output from the output terminal 123. Moreover, it is not necessary to increase the digital processing speed of the arithmetic operation processing circuit 95 so much, and yet the signal components in the high-frequency band can be reproduced with a high fidelity.

Embodiment 14

Figure 25:
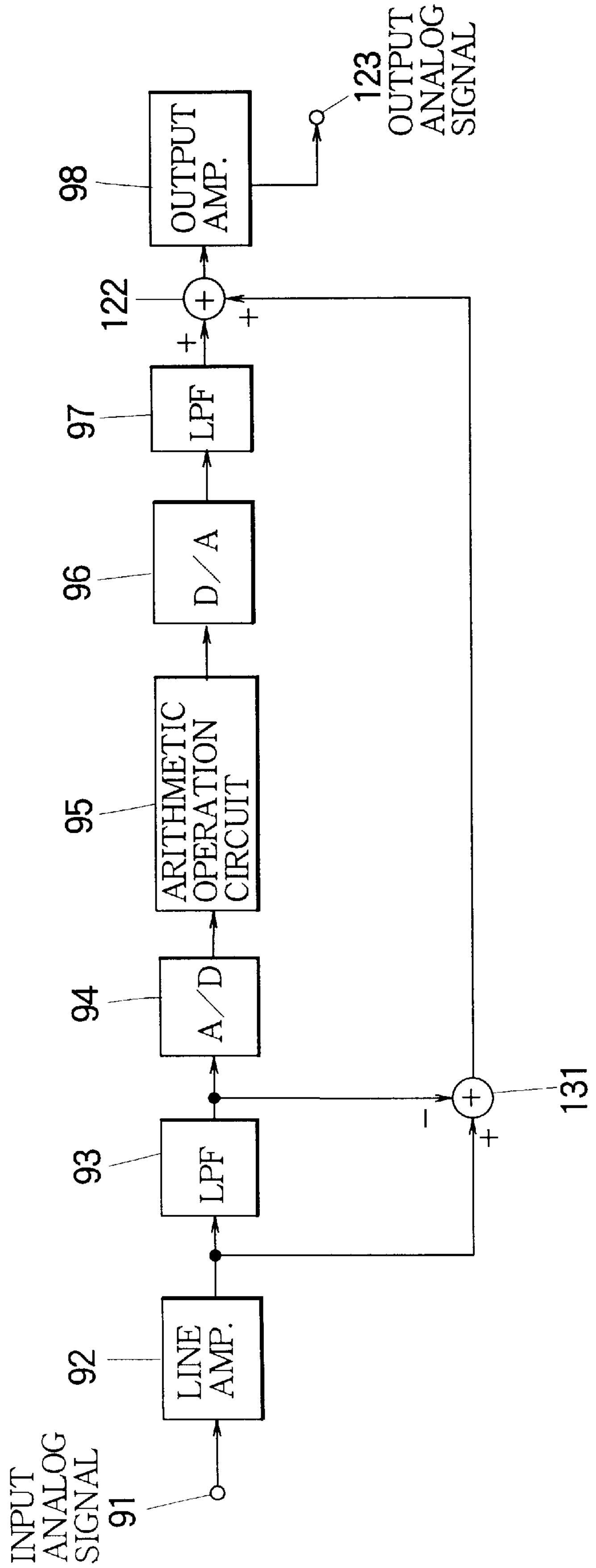
FIG. 25 is a block diagram showing the configuration of in Embodiment 14 of the invention.

FIG. 25 shows the configuration of the acoustic replay device of Embodiment 14. Reference numeral 131 denotes a second adder connected to the line amplifier 92 and the first low-pass filter 93. The output of the low-pass filter 93 is subtracted from the analog signal received at the input terminal 91, so that the function equivalent to the high-pass filter 121 in Embodiment 13 can be realized, and a similar effects can be obtained without providing the additional high-pass filter. In such a configuration, the combination of the low-pass filter 93 and the adder 131 may be regarded as forming a high-pass filter. The other reference numerals in FIG. 25 denote members of the identical reference numerals in Embodiment 13.

Still alternatively, in place of the low-pass filter 93, a combination of the high-pass filter 121 and an adder subtracting the output of the high-pass filter 121 from the output of the line amplifier 92 may be used. Such a combination may be regarded as forming a low-pass filter.

Embodiment 15

Figure 26:
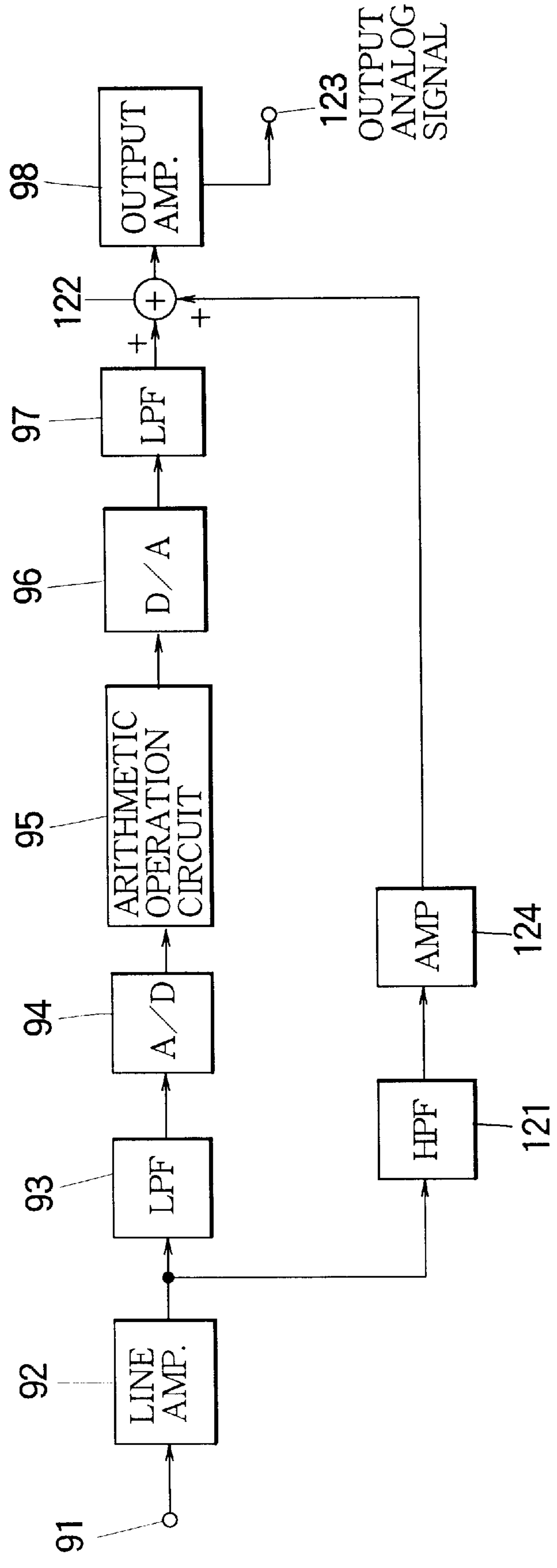
FIG. 26 is a block diagram showing the configuration of in Embodiment 15 of the invention.

FIG. 26 shows the configuration of the acoustic replay device of Embodiment 15. Reference numeral 124 denotes an amplifier connected to the high-pass filter 121. The amplifier 124 converts the level of the analog signal extracted by the high-pass filter 121. The other reference numerals in FIG. 36 denotes members of the same reference numerals in Embodiment 13.

The operation of the acoustic replay device of Embodiment 15 will next be described.

Figure 27:
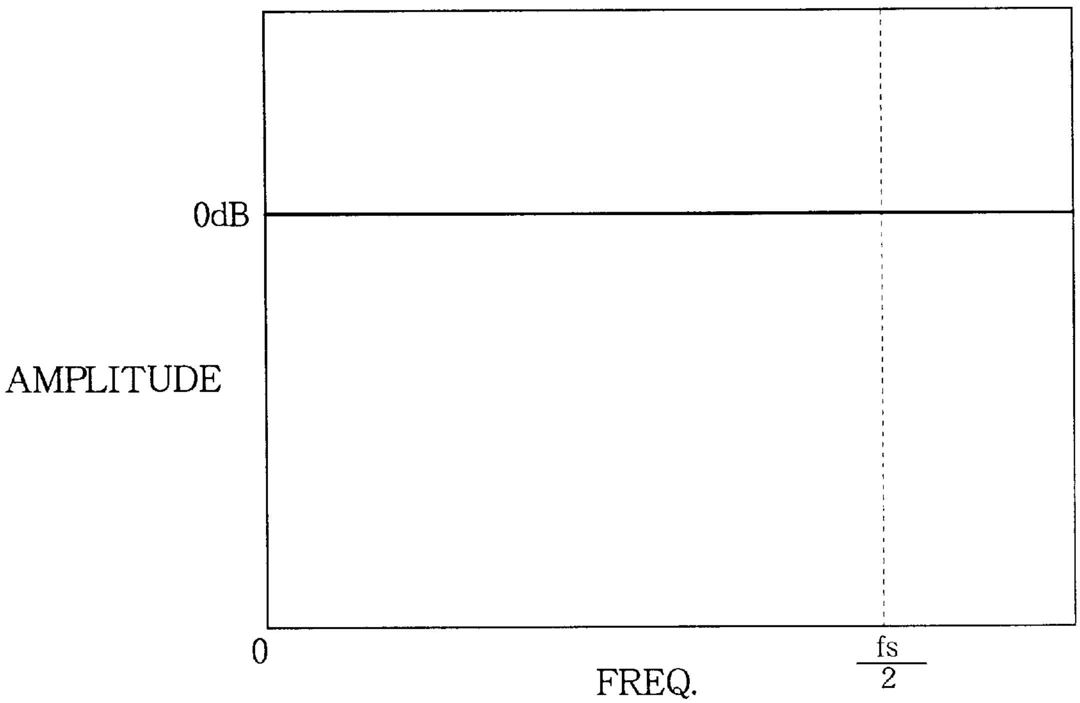
FIG. 27 is a diagram showing the level of the input analog signal in Embodiment 15.
Figure 28:
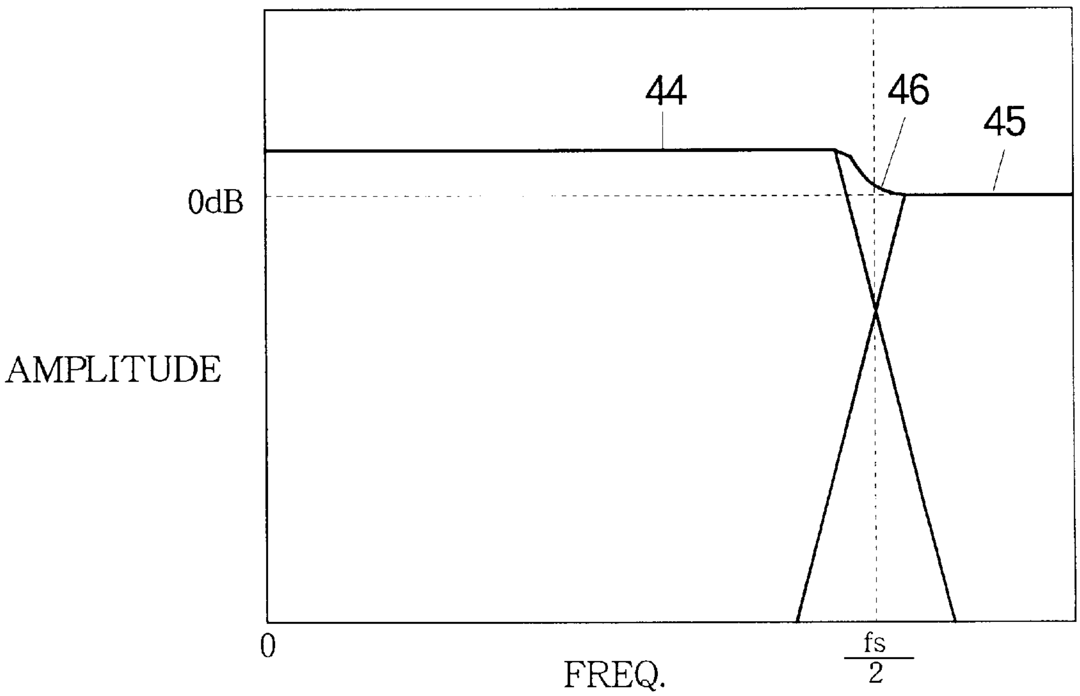
FIG. 28 is a diagram showing the level of the output of the arithmetic operation processing circuit and the high-pass filter in Embodiment 15.

FIG. 27 shows the level of the input analog signal. FIG. 28 shows the levels of the outputs of the arithmetic operation processing circuit and the high-pass filter. In the acoustic replay device shown in FIG. 26, where the digital signal processing circuit in the arithmetic operation processing circuit 95 has the amplification function, and if the amplifier 124 were not provided, the amplitude level of the amplitude characteristic 144 of the arithmetic operation processing circuit 95 would be different from the amplitude level of the amplitude characteristic 145 of the high-pass filter 121. Accordingly, the amplitude characteristic of the sum of the outputs of the second low-pass filter 97 and the high-pass filter 121 would not be flat as indicated by curve 146 in FIG. 28, and the input analog signal could not be replayed with a high-fidelity. By the use of the amplifier 124, it is possible to adjust the level of the analog signal extracted by the high-pass filter 121, before addition to the analog signal component from the D/A converter 96.

Figure 29:
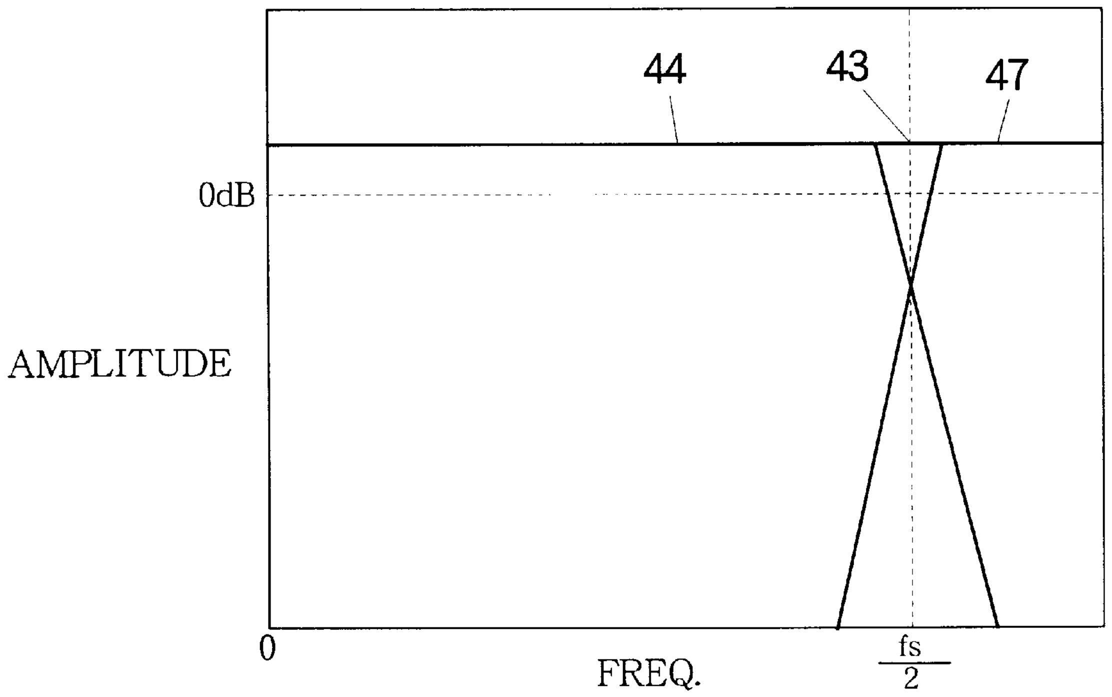
FIG. 29 is a diagram showing the synthetic characteristic of an acoustic replay device with the level being adjusted, in Embodiment 15.

FIG. 29 shows the synthetic characteristic of the acoustic replay device with the level adjustment. Reference numeral 147 denotes the amplitude characteristic of the high-pass filter 121 amplified by the amplifier 124. Using the amplifier 124 to amplify the analog signal through the high-pass filter 121 into conformity with the the output level of the arithmetic operation processing circuit 95, the level of the synthetic characteristic of the signal after the addition can be made flat. Accordingly, where it is intended to transmit all the frequency bands contained in the input analog signal, and replay the analog signal up to the range above one half the sampling frequency with a high fidelity, the level of the signal component below fs/2 with the amplitude characteristic 144 and the level of the signal above fs/2 with the amplitude characteristic 147 can be made equal.

In the acoustic replay device shown in FIG. 26, the high-pass filter 121 and the low-pass filter 93 are shown to be of separate filters. But, as in Embodiment 14, the combination of the second adder 131 and the low-pass filter 93 may be used in place of the high-pass filter 121. In such a case the combination of the second adder 131 and the low-pass filter may be regarded as forming the high-pass filter. Still alternatively, in place of the low-pass filter 93, a combination of the high-pass filter 121 and an adder subtracting the output of the high-pass filter 121 from the output of the line amplifier 92 may be used. Such a combination may be regarded as forming a low-pass filter.

In Embodiment 15, the output signal of the high-pass filter 121 is input to the amplifier 124, but the order of the high-pass filter 121 and the amplifier 124 may be reversed.

Embodiment 16

Figure 30:
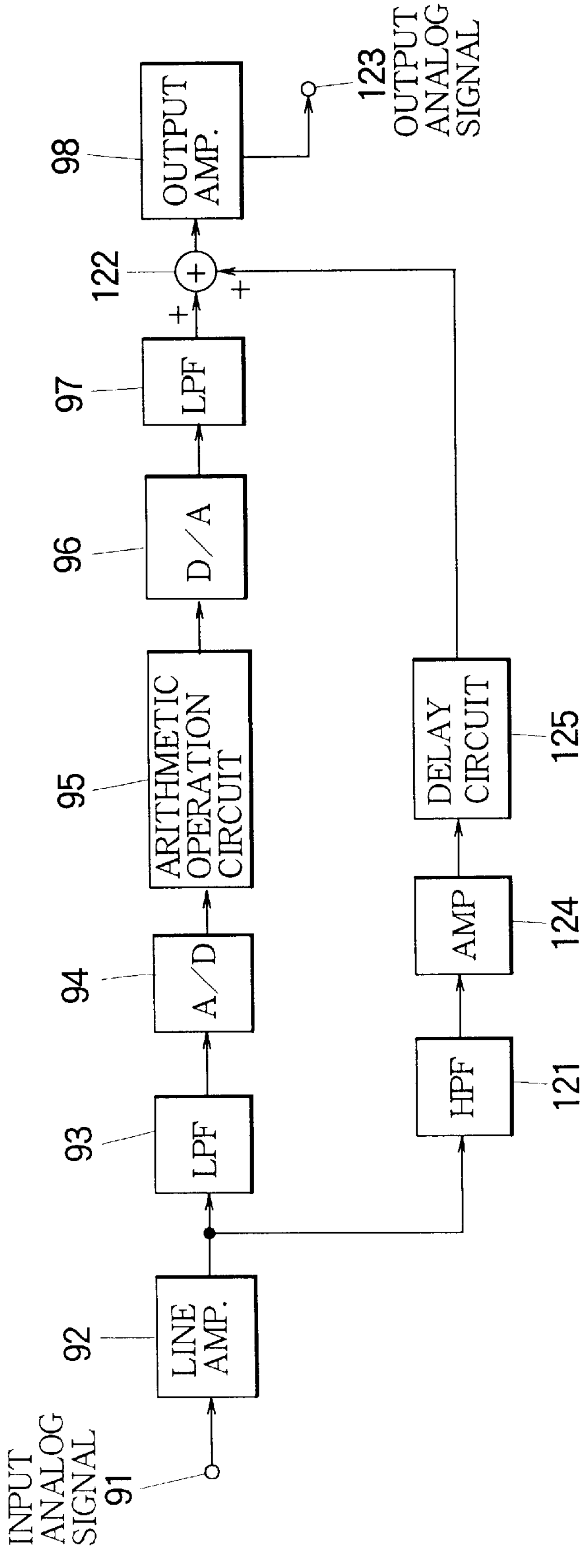
FIG. 30 is a block diagram showing the configuration of in Embodiment 16 of the invention.

FIG. 30 shows the configuration of the acoustic replay device of Embodiment 16. In the drawing, reference numeral 125 denotes a delay circuit for delaying the analog signal transmitted through the high-pass filter 121. The other reference numerals denote the members of the identical reference numerals in Embodiment 15.

Figure 31:
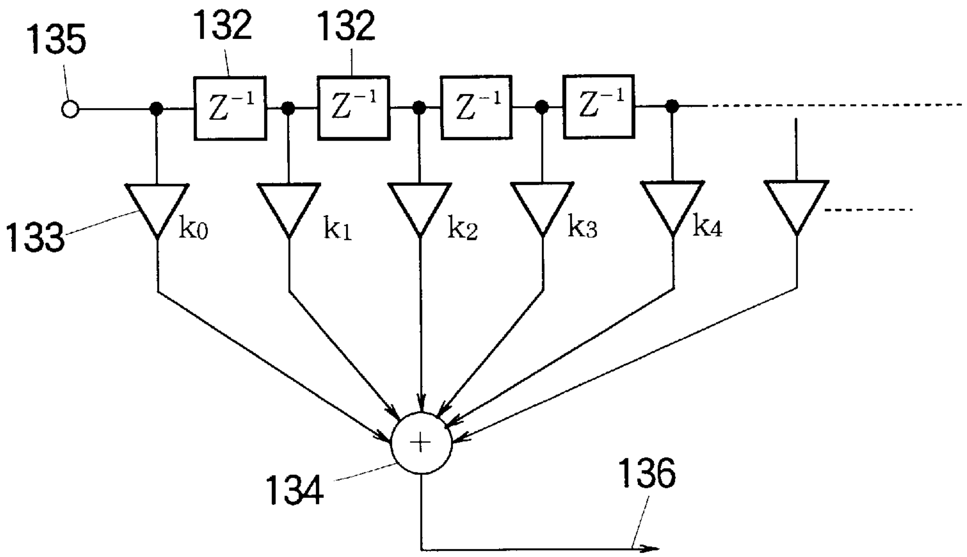
FIG. 31 is a block diagram showing an example of an arithmetic operation processing circuit in Embodiment 16.

FIG. 31 shows an example of the arithmetic operation processing circuit 95 in FIG. 30. In the drawing, reference numeral 132 denotes delay circuits for one sample period, 133 denotes coefficient multipliers, 134 denote an adder, 135 denotes an input terminal and 136 denotes an output terminal. This arithmetic operation processing circuit forms a non-recursive digital filter for the digital signal input via the input terminal 135, and the output signal via the output terminal 136 is supplied to the D/A converter 96 with a delay given by the delay circuits 132.

Figure 32:
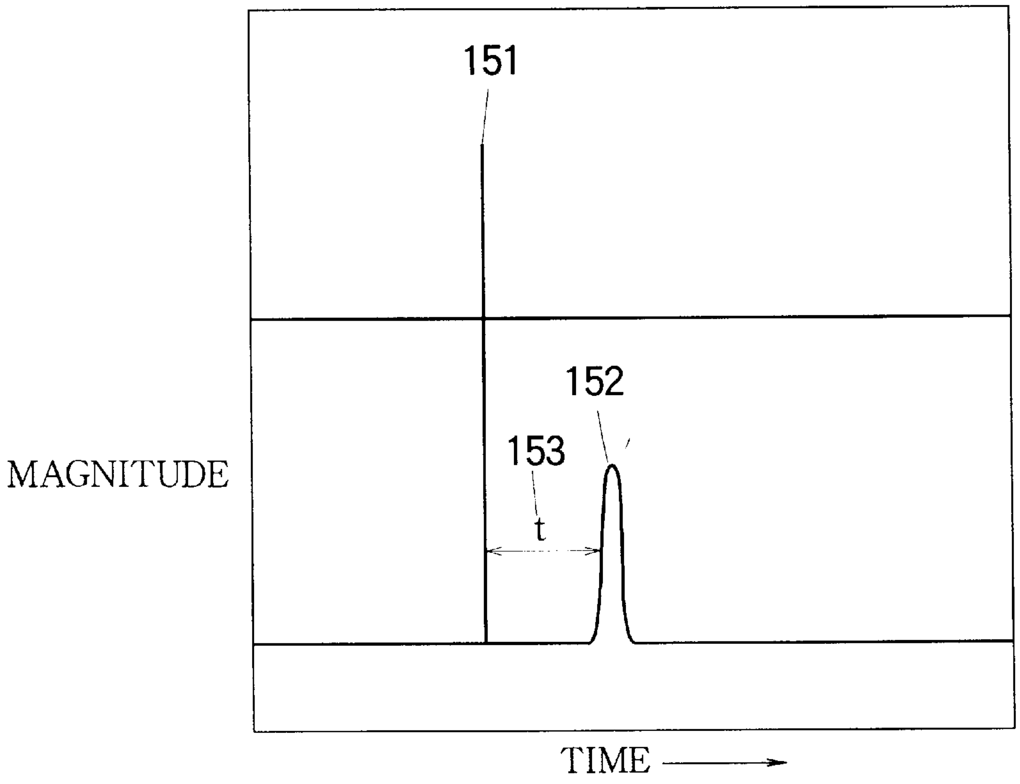
FIG. 32 is a diagram showing a delay time in the arithmetic operation processing circuit in Embodiment 16.

FIG. 32 shows the delay time at this arithmetic operation processing circuit. In the drawing, the horizontal axis represents the time and the vertical axis represents the magnitude of the signal. Reference numeral 151 denotes a timing of the input of the analog signal, 152 denotes a timing of the output of the analog signal from the second low-pass filter 97, and 153 denotes the time difference between the input and output of the arithmetic operation processing circuit 95.

Figure 33:
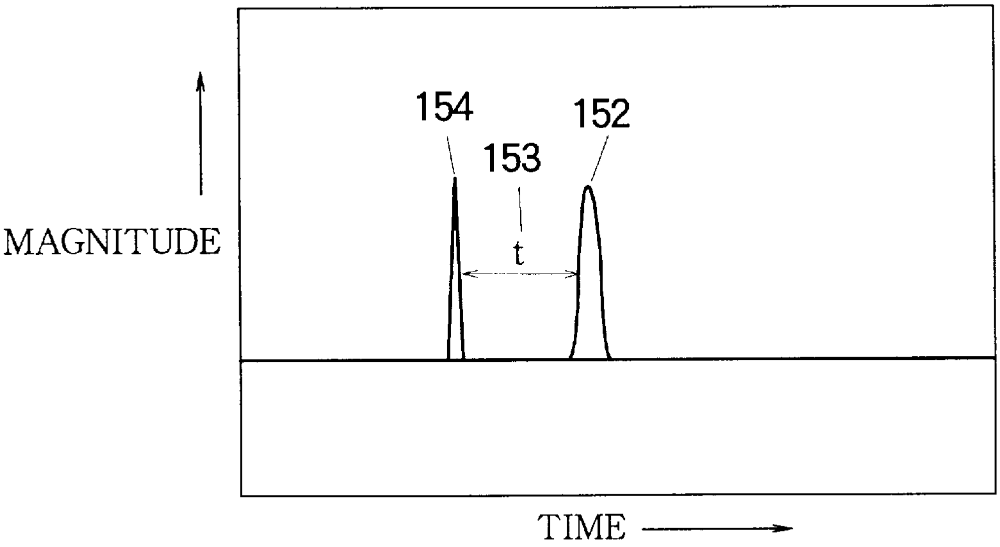
FIG. 33 is a diagram showing the time response of the acoustic replay device including an arithmetic operation processing circuit having a delay time, in Embodiment 16.

FIG. 33 shows the response of the acoustic replay device having the arithmetic operation processing circuit with the delay time. Reference numeral 154 denotes the response of the output of the high-pass filter 121.

Figure 34:
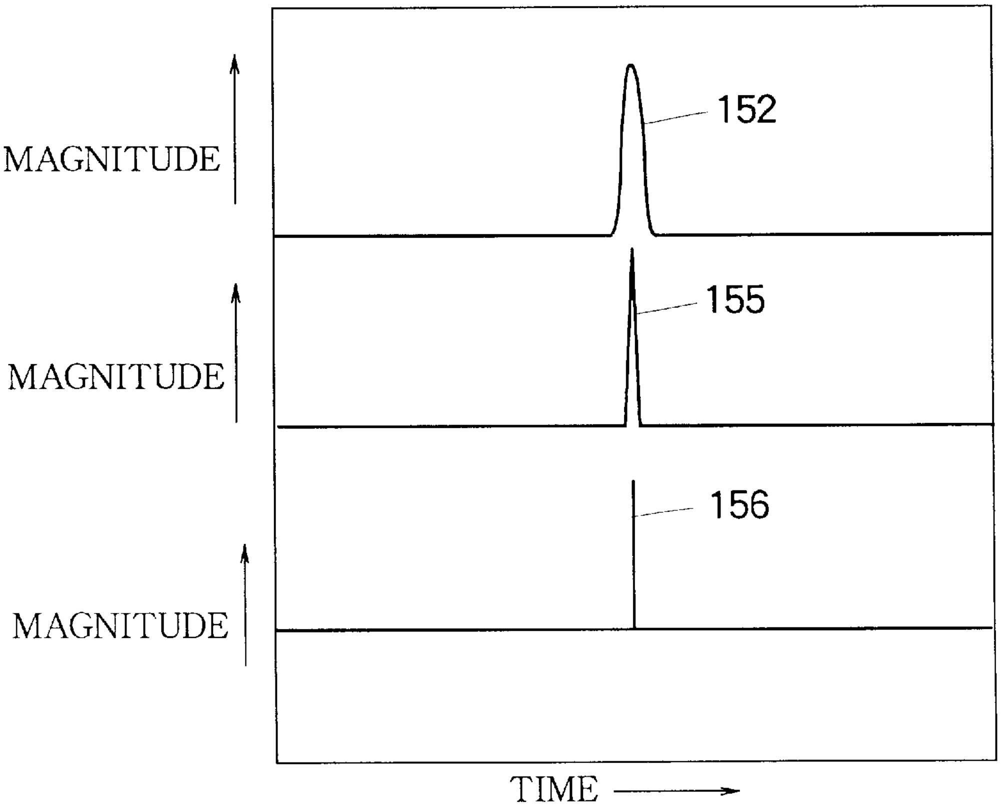
FIG. 34 is a diagram showing the time response of the synthetic characteristic of the acoustic replay device, with the delay being adjusted, in Embodiment 16.
Figure 35:
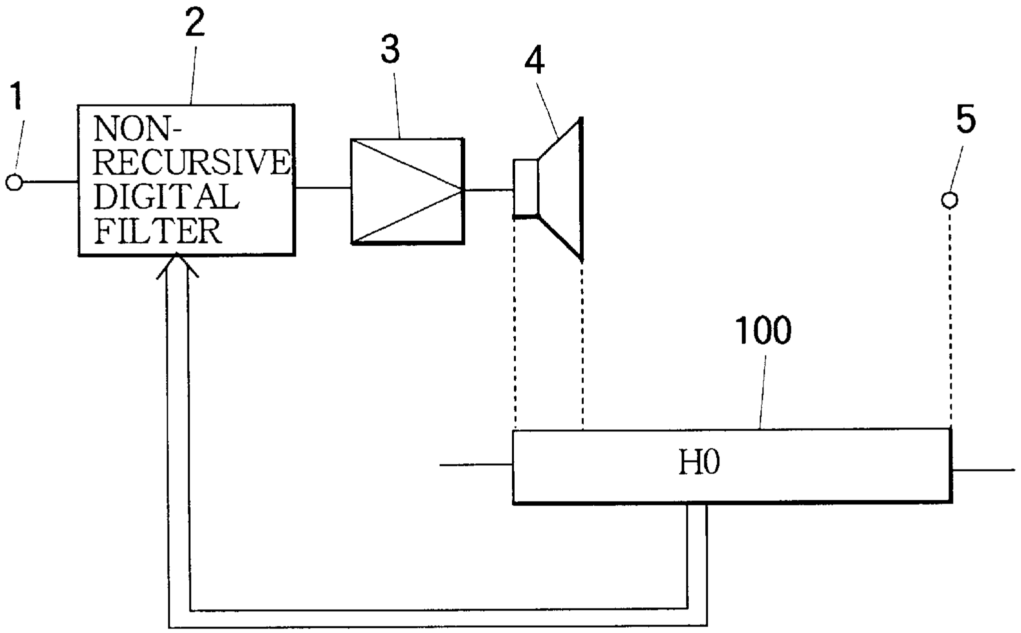
FIG.35 PRIOR ART
FIG. 35 is a diagram showing the configuration of a conventional acoustic replay device.

FIG. 34 shows the response of the synthetic characteristic of the acoustic replay device with the adjusted delay. Reference numeral 155 denotes the response with the delay by the delay circuit 125, while 156 denotes the response of the synthetic characteristic.

The operation of the acoustic replay device of Embodiment 16 will next be described.

In the arithmetic operation processing circuit 95, digital filtering operation is effected on the signal having been band-limited. In the case of the non-recursive digital filter shown in FIG. 31, for instance, the signals obtained through the delay circuits 132 and the coefficient multipliers are added until the input signal received at the input terminal 135 reaches the output terminal 136. During such calculation, the input digital signal is transmitted to the output terminal 136, being delayed as shown in FIG. 32. Accordingly, if the analog signal having been subjected to the digital calculation, and the analog signal having passed through the high-pass filter, without being delayed, are added, the input analog signal could not be reproduced with a high-fidelity, since there is a difference between the two signals, as shown in FIG. 33.

In the configuration of the acoustic replay device shown in FIG. 30, the analog signals passing through the high-pass filter 121, is subjected to level adjustment into conformity with the output of the arithmetic operation processing circuit 95 at the amplifier 124, and is then delayed using the delay circuit 125 for the delay time of the digital arithmetic operation. Accordingly, the delay times of the two analog signals input to the first adder 122 are equal, and the response of the synthetic characteristic, which is obtained as a result of the summation at the two signals, is uniform independent of the frequency band.

In the acoustic replay device of FIG. 30, the high-pass filter 121 and the low-pass filter 93 are shown to be separate filters, but like Embodiment 14, the second adder 131 and the low-pass filter 93 may be used to form the high-filter 121. Still alternatively, a combination of a high-pass filter 121 and an adder may be used in place of the low pass filter 93.

The order of signal transmission in the high-pass filter 121, the amplifier 124 and the delay circuit 125 may be other than that illustrated.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An acoustic replay device for power-amplifying an audio signal, and radiating sound via a speaker, comprising a ducted horn disposed on the speaker;

audio signal processing means, including a non-recursive digital filter, realizing an inverse characteristic of a transfer characteristic of said ducted horn excluding a transfer characteristic of the speaker and excluding a transfer characteristic of an acoustic space from an opening of said ducted horn to a listening position of the speaker; and a linear phase equalizer, changing an amplitude characteristic of the audio signal without changing a phase characteristic of the audio signal.

2. The acoustic replay device of claim 1, wherein said audio signal processing means includes, a transmission path connected to an adder; and a plurality of coefficient multipliers forming a digital filter.

3. The acoustic replay device of claim 1, wherein said audio signal processing means includes, a coefficient multiplier, adjusting an amplitude level of the audio signal, and a plurality of coefficient multipliers forming a digital filter.

4. The acoustic replay device of claim 1, wherein said audio signal processing means includes a plurality of coefficient multipliers forming a digital filter, wherein one of said plurality of coefficient multipliers is selected in accordance with a selection control signal.

5. An acoustic replay device for power-amplifying an audio signal, and radiating sound via a speaker, comprising:

a ducted horn disposed on the speaker;

an acoustic resistance disposed at an opening of said ducted horn;

audio signal processing means, including a non-recursive digital filter, realizing an inverse characteristic of a synthetic transfer characteristic of said ducted horn and said acoustic resistance; and a linear phase equalizer for changing an amplitude characteristic of the audio signal without changing a phase characteristic of the audio signal.

6. The acoustic replay device of claim 5, wherein said audio signal processing means includes, a transmission path connected to an adder, and a plurality of coefficient multipliers forming a digital filter.

7. The acoustic replay device of claim 5, wherein said audio signal processing means includes, a coefficient multiplier, adjusting an amplitude level of the audio signal, and a plurality of coefficient multipliers forming a digital filter.

8. The acoustic replay device of claim 5, wherein said audio signal processing means includes, a plurality of coefficient multipliers forming a digital filter, wherein one of said plurality of coefficient multipliers is selected in accordance with a selection control signal.

9. An acoustic replay device for varying and replaying an audio signal comprising:

audio signal processing means including an adaptive finite impulse response (FIR) digital filter;

selecting means for selectively connecting said audio signal processing means to an audio signal source and a noise source; and acoustic level detecting means disposed at a listening position for the replayed audio signal;

wherein a noise signal from the noise source is replayed by being selected by said selecting means, and coefficient data for an inverse filter are generated and set in said FIR digital filter, based on a signal detected by said acoustic level detecting means and the noise signal from the noise source, and a sound pressure frequency characteristic at the listening position is corrected using said FIR digital filter connected to said audio signal source by said selecting means;

said audio signal processing means including, difference determining means for determining a difference between the signal detected by said acoustic level detecting means and the noise signal from the noise source, and an LMS calculator, receiving the difference determined by said difference determining means and repeatedly updating the coefficient data set in said adaptive FIR digital filter until the difference converges, whereby the coefficient data set when the difference converges is used as the coefficient data for the inverse filter.

10. The acoustic replay device of claim 9, wherein said acoustic level detecting means includes a remote controller with a microphone.

11. The acoustic replay device of claim 9, wherein said audio signal processing means includes a transmission path connected to an adder, and a plurality of coefficient multipliers forming a digital filter.

12. The acoustic replay device claim 9, wherein said audio signal processing means includes a coefficient multiplier for adjusting an amplitude level of the audio signal, and a plurality of coefficient multipliers forming a digital filter.

13. The acoustic replay device of claim 9, wherein said audio signal processing means includes a plurality of coefficient multipliers forming a digital filter wherein on of said plurality of coefficient multipliers is selected in accordance with a selection control signal.

14. An acoustic replay device comprising:

a ducted horn disposed on a speaker; and audio signal processing means, including a non-recursive digital filter realizing an inverse characteristic of a transfer characteristic of said ducted horn, excluding a transfer characteristic of the speaker and excluding a transfer characteristic of an acoustic space from an opening of said ducted horn to a listening position of the speaker.

15. The acoustic replay device of claim 14, further comprising:

a linear phase equalizer, varying only an amplitude characteristic of the audio signal.

16. The acoustic replay device of claim 14, wherein said audio signal processing means includes, a transmission path connected to an adder; and a plurality of coefficient multipliers forming a digital filter.

17. An acoustic replay device, comprising:

a ducted horn, disposed on a speaker; and an acoustic resistance, disposed at an opening of said ducted horn; and audio signal processing means, including a non-recursive digital filter, realizing an inverse characteristic of a synthetic transfer characteristic of said ducted horn and said acoustic resistance, excluding a transfer characteristic of the speaker and excluding a transfer characteristic of an acoustic space from said acoustic resistance to a listening position of the speaker.

18. The acoustic replay device according to claim 17, further comprising:

a linear phase equalizer for varying only an amplitude characteristic of the audio signal.

19. The acoustic replay device of claim 17, wherein said audio signal processing means includes, a transmission path connected to an adder, and a plurality of coefficient multipliers forming a digital filter.

* * * * *